(12) United States Patent
Ishikawa et al.

(10) Patent No.: US 7,069,645 B2
(45) Date of Patent: Jul. 4, 2006

(54) METHOD FOR PRODUCING A CIRCUIT BOARD

(75) Inventors: Takahiro Ishikawa, Nagoya (JP);
Masahiro Kida, Ama-Gun (JP); Shuhei Ishikawa, Handa (JP); Nobuaki Nakayama, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 441 days.

(21) Appl. No.: 10/107,893

(22) Filed: Mar. 27, 2002

(65) Prior Publication Data

US 2002/0138973 A1    Oct. 3, 2002

(30) Foreign Application Priority Data

Mar. 29, 2001    (JP)    ............... 2001-097313

(51) Int. Cl.
*H05K 3/36*    (2006.01)
(52) U.S. Cl. .............. 29/830; 29/831; 29/846; 29/847; 174/260; 174/255; 216/13; 216/108
(58) Field of Classification Search ........... 29/830–834, 29/846, 847, 853; 174/255, 260, 263; 361/761–766; 216/83, 108, 13, 41
See application file for complete search history.

(56) References Cited

U.S. PATENT DOCUMENTS

| | | | |
|---|---|---|---|
| 4,770,900 A * | 9/1988 | Seibel .................. | 430/314 |
| 5,240,551 A * | 8/1993 | Matsumura et al. ........ | 216/20 |
| 5,302,492 A * | 4/1994 | Ott et al. ............. | 430/314 |
| 5,354,415 A | 10/1994 | Fushii et al. | |
| 5,603,158 A * | 2/1997 | Murata et al. ............. | 29/846 |
| 5,906,042 A * | 5/1999 | Lan et al. ................ | 29/852 |
| 6,284,985 B1 * | 9/2001 | Naba et al. ............... | 174/260 |
| 6,354,484 B1 * | 3/2002 | Sakuraba et al. ........ | 228/124.1 |
| 6,606,793 B1 * | 8/2003 | Dunn ..................... | 29/853 |
| 6,918,529 B1 * | 7/2005 | Tsukaguchi et al. ..... | 228/122.1 |

FOREIGN PATENT DOCUMENTS

| | | |
|---|---|---|
| EP | 0 480 038 B1 | 7/1997 |
| JP | 04-322491 A | 11/1992 |
| JP | 05-013920 A | 1/1993 |
| JP | 05-243699 A1 | 9/1993 |
| JP | 06-177507 A1 | 6/1994 |
| JP | 06-177513 A1 | 6/1994 |
| JP | 07-099380 A | 4/1995 |
| JP | 07-142858 A1 | 6/1995 |
| JP | 07-202381 A1 | 8/1995 |
| JP | 07-235750 A | 9/1995 |
| JP | 08-097554 A | 4/1996 |
| JP | 2-594475 | 12/1996 |
| JP | 09-181423 A | 7/1997 |
| JP | 10-154866 A | 6/1998 |
| JP | 11-307696 A | 11/1999 |
| JP | 2000-174183 A1 | 6/2000 |
| JP | 2002-043482 | 2/2002 |

\* cited by examiner

*Primary Examiner*—Minh Trinh
(74) *Attorney, Agent, or Firm*—Burr & Brown

(57) ABSTRACT

A method for producing a circuit board having a metal circuit pattern on an insulating substrate is provided, including the steps of joining a metal plate onto a surface of the insulating substrate using a hard brazing member containing an active element and removing unnecessary conductive layer portions adjacent a metal circuit pattern of the metal plate to at least partially expose a portion of the surface of the insulating substrate.

17 Claims, 37 Drawing Sheets

FIG. 8

| MATERIAL | ETCHING RATE | |
| --- | --- | --- |
| | AIR PRESSURE =0.25MPa | AIR PRESSURE =0.1MPa |
| AlN | 13 μm/sec | 4.8 μm/sec |
| $Si_3N_4$ | 2.7 μm/sec | 1.4 μm/sec |
| Cu | 1.5 μm/sec | 0.8 μm/sec |
| Ni | 2 μm/sec | 1.2 μm/sec |
| TiN | 10 μm/sec | 3 μm/sec |
| 63Ag-35Cu-2Ti | 1.6 μm/sec | 0.9 μm/sec |

FIG. 15

| | JOINING STRUCTURE: THICKNESS OF EACH MEMBER (mm) | | | | STATE AFTER 500 CYCLES | STATE AFTER 3000 CYCLES |
|---|---|---|---|---|---|---|
| | CIRCUIT | INSULATING SUBSTRATE | BUFFER PLATE | METAL PLATE | | |
| EXAMPLE 1 | 0.3 | 0.3 | 0.1 | 2.7 | NO EXFOLIATION | NO EXFOLIATION |
| EXAMPLE 2 | 0.3 | 0.3 | 0.2 | 2.7 | NO EXFOLIATION | NO EXFOLIATION |
| EXAMPLE 3 | 0.3 | 0.3 | 0.3 | 2.7 | NO EXFOLIATION | NO EXFOLIATION |
| COMPARATIVE EXAMPLE 1 | 0.3 | 0.3 | 0 | 2.7 | EXFOLIATION | — |

COMPARATIVE EXAMPLE 3

COMPARATIVE EXAMPLE 4

FIG. 20

| | JOINING STRUCTURE: THICKNESS OF EACH MEMBER (mm) | | | | STATE AFTER 3000 CYCLES | COEFFICIENT OF THERMAL CONDUCTIVITY (W/mK) | INSULATION PERFORMANCE |
|---|---|---|---|---|---|---|---|
| | CIRCUIT | INSULATING SUBSTRATE | BUFFER PLATE | METAL PLATE | | | |
| COMPARATIVE EXAMPLE 5 | 0.3 | 0.635 | 0.3 | 2.7 | NO EXFOLIATION | 250 | GOOD |
| EXAMPLE 5 | 0.3 | 0.3 | 0.3 | 2.7 | NO EXFOLIATION | 290 | GOOD |
| EXAMPLE 6 | 0.3 | 0.15 | 0.3 | 2.7 | NO EXFOLIATION | 308 | GOOD |
| EXAMPLE 7 | 0.3 | 0.1 | 0.3 | 2.7 | NO EXFOLIATION | 325 | GOOD |
| EXAMPLE 8 | 0.3 | 0.07 | 0.3 | 2.7 | NO EXFOLIATION | 340 | GOOD |

FIG. 22

| | THICKNESS OF CIRCUIT (mm) | AVERAGE AMOUNT OF WARPAGE ($\mu$m) |
|---|---|---|
| COMPARATIVE EXAMPLE 6 | 0.3 | CONVEX 259.0 |
| COMPARATIVE EXAMPLE 7 | 1 | CONVEX 150.1 |
| EXAMPLE 13 | 3 | CONCAVE 278.1 |
| EXAMPLE 14 | 10 | CONCAVE 432.4 |

FIG. 24

|  | THICKNESS OF CIRCUIT (mm) | TYPE OF INSULATING SUBSTRATE | THICKNESS OF BUFFER PLATE (mm) | AMOUNT OF WARPAGE (μm) |
|---|---|---|---|---|
| EXAMPLE 15 | 0.3 | AlN | 0.3 | CONCAVE 178 |
| EXAMPLE 16 | 0.3 | AlN | 0 | CONCAVE 293 |
| EXAMPLE 17 | 0.3 | $Si_3N_4$ | 0.3 | CONVEX 178 |
| EXAMPLE 18 | 0.3 | $Si_3N_4$ | 0 | CONVEX 177 |
| EXAMPLE 19 | 0.3 | $Si_3N_4$ | 0.1 | CONVEX 130 |
| EXAMPLE 20 | 0.3 | $Si_3N_4$ | 0.1 | CONVEX 123 |
| EXAMPLE 21 | 0.3 | $Si_3N_4$ | 0.3 | CONVEX 143 |
| EXAMPLE 22 | 0.3 | $Si_3N_4$ | 0.3 | CONVEX 171 |
| EXAMPLE 23 | 0.3 | $Si_3N_4$ | 0.3 | CONVEX 134 |
| EXAMPLE 24 | 0.3 | $Si_3N_4$ | 0.3 | CONVEX 153 |
| EXAMPLE 25 | 0.3 | $Si_3N_4$ | 0.6 | CONVEX 206 |
| EXAMPLE 26 | 0.3 | $Si_3N_4$ | 0.6 | CONVEX 277 |

FIG. 28

| | JOINING STRUCTURE: THICKNESS OF EACH MEMBER (mm) | | | | JOINING TEMPERATURE (°C) | JOINING TIME (min) | STATE AFTER 3000 CYCLES | COEFFICIENT OF THERMAL CONDUCTIVITY (W/mK) |
|---|---|---|---|---|---|---|---|---|
| | CIRCUIT | INSULATING SUBSTRATE | BUFFER PLATE | METAL PLATE | | | | |
| EXAMPLE 34 | 0.3 | 0.3 | 0.3 | 2.7 | 680 | 10 | NO EXFOLIATION | 270 |
| EXAMPLE 35 | 0.3 | 0.3 | 0.3 | 2.7 | 680 | 10 | NO EXFOLIATION | 275 |
| EXAMPLE 36 | 0.3 | 0.3 | 0.3 | 2.7 | 780 | 10 | NO EXFOLIATION | 290 |

FIG. 30

| | THICKNESS OF BRAZING MEMBER ① (μm) | THICKNESS OF BRAZING MEMBER ② (μm) | POLLUTION OF CIRCUIT AND OTHER PARTS | PEEL STRENGTH (kgf/cm²) | STATE AFTER 500 CYCLES | COEFFICIENT OF THERMAL CONDUCTIVITY (W/mK) |
|---|---|---|---|---|---|---|
| COMPARATIVE EXAMPLE 8 | 50 | 50 | EXTREME | 85 | NO EXFOLIATION | 270 |
| COMPARATIVE EXAMPLE 9 | 50 | 10 | EXTREME | 32 | NO EXFOLIATION | 275 |
| EXAMPLE 41 | 30 | 30 | SLIGHT | 52 | NO EXFOLIATION | 270 |
| EXAMPLE 42 | 10 | 30 | SCARCELY OBSERVABLE | 55 | NO EXFOLIATION | 270 |
| EXAMPLE 43 | 10 | 50 | SCARCELY OBSERVABLE | 90 | NO EXFOLIATION | 270 |
| COMPARATIVE EXAMPLE 10 | 10 | 10 | SCARCELY OBSERVABLE | 30 | NO EXFOLIATION | 270 |

FIG. 31

| | BRAZING MEMBER :Ti | PEEL STRENGTH (kgf/cm²) | COEFFICIENT OF THERMAL CONDUCTIVITY | COEFFICIENT OF THERMAL CONDUCTIVITY (W/mK) |
|---|---|---|---|---|
| COMPARATIVE EXAMPLE 11 | 10:0 | 32 | NO EXFOLIATION | 270 |
| EXAMPLE 44 | 10:0.7 | 65 | NO EXFOLIATION | 275 |
| EXAMPLE 45 | 10:1 | 90 | NO EXFOLIATION | 270 |
| EXAMPLE 46 | 10:2 | 115 | NO EXFOLIATION | 270 |

FIG. 32

| | SURFACE ROUGHNESS (μm) | | | SPECULAR REFLECTION (%) | BONDER OUTPUT (Wsec) |
|---|---|---|---|---|---|
| | Ra | Rmax | Rz | | |
| COMPARATIVE EXAMPLE 12 | 2.1 | 20.2 | 12.3 | 3.2 | - |
| EXAMPLE 47 | 0.04 | 0.35 | 0.15 | 593.3 | 6.3 |
| EXAMPLE 48 | 0.11 | 1.55 | 1.2 | 208 | 8 |
| EXAMPLE 49 | 0.19 | 1.83 | 1.38 | 209.3 | 9.8 |
| EXAMPLE 50 | 0.28 | 3.9 | 2.92 | 212.5 | 8 |
| EXAMPLE 51 | 0.42 | 5.35 | 3.3 | 13.3 | 20 |
| EXAMPLE 52 | 0.54 | 4.3 | 3.25 | 417 | 11 |
| EXAMPLE 53 | 0.73 | 5.9 | 4.37 | 60.5 | 20 |

METHOD FOR PRODUCING A CIRCUIT BOARD

BACKGROUND OF THE INVENTION

1. Field of the Invention

The present invention relates to a circuit board which has a circuit on an insulating substrate, and a method for producing the same. The present invention relates to a circuit board which is preferably used, for example, as a circuit board for cooling an electronic circuit chip composed of a semiconductor or the like, and a method for producing the same.

2. Description of the Related Art

It is important for a general circuit board for mounting thereon a semiconductor device to efficiently transmit the heat generated by the semiconductor device to the outside. In other words, the heat is a great enemy for the semiconductor device. It is necessary that the internal temperature does not exceed the maximum permissible joining temperature. In a semiconductor device such as a power transistor or a semiconductor rectifying device, the electric power consumption per operation area is large. Therefore, the generated amount of heat is released insufficiently with only an amount of heat released from the case (package) and the lead of the semiconductor device. The internal temperature of the device may be raised, resulting in thermal destruction.

A semiconductor device which carries CPU suffers the same problem as described above. The generated amount of heat is increased as the clock frequency is improved. Therefore, the thermal design in consideration of the heat release is important.

According to the thermal design of preventing the thermal destruction, the circuit board design and the mounting design are performed for securing a heat sink having a large heat release area to the case (package) of the semiconductor device.

Explanation will now be made with reference to FIG. 36 for a conventional circuit board 200 to which a heat-control measure is applied (see, for example, Japanese Laid-Open Patent Publication No. 11-307696).

As shown in FIG. 36, the circuit board 200 comprises a metal base plate 202 for releasing the heat generated by a semiconductor chip, a ceramic plate 206 for insulating the semiconductor chip 204 from the metal base plate 202, a circuit 210 of a metal plate 224 disposed on the upper surface of the ceramic plate 206 with a brazing member 208 interposed therebetween, a lower electrode plate 214 disposed on the lower surface of the ceramic plate 206 with a brazing member 212 interposed therebetween, a metal spacer 216 for widening the distance between the metal base plate 202 and the ceramic plate 206, a brazing member 218 for securing the metal spacer 216 to the metal base plate 202, a solder layer 220 for securing the semiconductor chip 204 onto a circuit 210, and a solder layer 222 for securing the lower electrode plate 214 onto the metal spacer 216.

In the conventional circuit board 200 shown in FIG. 36, when the circuit 210 is formed on the ceramic plate 206, the metal plate 224 is firstly joined onto the ceramic plate 206 using the brazing member 208. Next, the metal plate 224 is selectively etched to form the circuit 210 having a predetermined circuit pattern. The technique for forming the circuit 210 by etching the metal plate 224 is disclosed, for example, in Japanese Laid-Open Patent Publication Nos. 8-97554, 9-181423, and 7-235750.

A brazing member containing an active metal is used as the brazing member 208 for joining the metal plate 224 onto the ceramic plate 206. In this case, it is possible to improve the joining strength between the ceramic plate 206 and the circuit 210.

However, when the ceramic plate 206 and the metal plate 224 are joined to one another using the brazing member 208 as shown in FIG. 36, a conductive reactive layer 226 is formed between the ceramic plate 206 and the metal plate 224 as shown in FIG. 37. The conductive reactive layer 226 cannot be removed by etching the metal plate 224, i.e., by the etching the metal plate 224 using an aqueous solution of ferric chloride or an aqueous solution of cupric chloride normally used for etching copper. The conductive reactive layer 226 consequently remains on the ceramic plate 206. If the conductive reactive layer 226 remains on the ceramic plate 206, the circuit 210 may be short-circuited.

In order to solve the problem, a method has been suggested, in which any unnecessary brazing matter (etching residue) containing a nitride layer of active metal, which remains after the circuit etching with the ferric chloride solution or the cupric chloride solution, is removed by performing another acid treatment after the etching step.

For example, Japanese Patent No. 2594475 discloses a method for removing the unnecessary brazing matter with hydrofluoric acid singly or with mixed acid of inorganic acid and hydrofluoric acid. Japanese Laid-Open Patent Publication No. 4-322491 discloses a method for removing the unnecessary brazing matter with ammonium halide. Japanese Laid-Open Patent Publication No. 5-13920 discloses a method for removing the unnecessary brazing matter with inorganic acid and hydrogen peroxide after treating the unnecessary brazing matter with hydrogen halide or ammonium halide.

Japanese Laid-Open Patent Publication No. 7-235750 discloses a method for removing the unnecessary brazing matter with a solution containing fluorine compound and hydrogen peroxide but containing no inorganic acid. Japanese Laid-Open Patent Publication No. 10-154866 discloses a method for removing the unnecessary brazing matter. The method comprises the steps of treating the unnecessary brazing matter with ammonium fluoride and hydrogen peroxide and treating the unnecessary brazing matter with a solution of alkaline and hydrogen peroxide.

However, according to these techniques, it is necessary to consider the safety of operation, because the hydrofluoric acid-based solution is used. Further, it is difficult to manage the steps, and it is impossible to completely remove the nitride layer of active metal.

It is assumed to use a technique for removing the unnecessary brazing matter by the honing laser machining as a technique for mechanically removing the unnecessary brazing matter (see, for example, Japanese Laid-Open Patent Publication No. 7-99380). However, the large apparatus may be constructed and the production cost is also large.

SUMMARY OF THE INVENTION

It is therefore an object of the present invention to provide a circuit board which is excellent in both of appearance and characteristics and in which any etching residue, such as a conductive reactive layer remaining on an insulating substrate, can be removed with ease, and a method for producing the same.

Another object of the present invention is to provide a circuit boart which controls the warpage of an entire joined unit so that a cooling fin made of metal or the like may be strongly fiwed, in addition to the above condition, and a method for producing the same.

The present invention provides a circuit board having a circuit on an insulating substrate. Thecircuit is formed by etching and sandblasting a plate of metal which is joined onto the insulating substrate.

According to another aspect of the present invention, there is provided a circuit board having a circuit on an insulating substrate, wherein the circuit is formed by sandblasting a plate of metal which is joined onto the insulating substrate and which has a circuit pattern.

The present inventors have paid attention to the fact that the velocity of removal differs between the metal material such as copper, aluminum, and silver brazing and the highly hard nomnetallic material such as nitride and oxide when various materials are sandblasted. The velocity of removing the latter is several times to several tens of times the velocity of removing the former.

The present inventors have found out the following fact. That is, only the nitride layer of the active metal, which has the fast velocity of removal in the sandblast, can be effectively removed scarcely affecting the circuit of the metal material having the slow velocity of removal in the sandblast even when the sandblast is applied to the entire surface under the same conditions for the metal material and the insulating material if no residual matter of the metal material is allowed to remain between parts of the formed circuit, i.e., only the nitride layer of the active metal formed on the insulating substrate (insulating material) is allowed to remain after joining the metal plate such as a copper plate to the insulating substrate with the active metal brazing to form the circuit. Thus, the present invention has been completed.

The circuit is formed by pressing and etching the metal plate. A plating layer may be stacked on the circuit of the metal.

In this case, it is preferable that a surface roughness of the circuit of the metal or a surface roughness of the plating layer on the circuit is not more than Ra=1. If the surface roughness exceeds Ra=1, for example, bonding wires hardly make tight contact in the wiring step to be performed thereafter.

The circuit of the metal may be joined onto the insulating substrate using a hard brazing member containing an active element. In this case, it is preferable that the hard brazing member has a thickness of not more than 10 μm. The objective substance to be removed by the sandblast is at least a part of the conductive reactive layer which is generated by a reaction between the insulating substrate and the active element in the hard brazing member and which exists at a metal-removed portion of the circuit.

At least one element belonging to any one of Group 2A, Group 3A, Group 4A, Group 5A, and Group 4B elements in the periodic table can be used as the active element contained in the hard brazing member.

It is also preferable that a heat spreader member or a heat sink member is joined to a lower portion of the insulating substrate. In this case, it is preferable that at least one of SiC, AlN, $Si_3N_4$, BeO, $Al_2O_3$, $Be_2C$, C, Cu, Cu alloy, Al, Al alloy, Ag, Ag alloy, and Si is used as a constitutive material for the heat spreader member or the heat sink member. Especially, it is preferable that the heat spreader member is composed of a composite material in which an SiC base material is impregnated with Cu or Cu alloy, or a composite material in which a C base material is impregnated with Cu or Cu alloy. The insulating substrate may be composed of AlN or $Si_3N_4$.

When the heat spreader member is joined to the lower portion of the insulating substrate, a buffer plate of metal may be joined between the insulating substrate and the heat spreader member using a hard brazing member containing an active element, and a first joined unit may be provided, which comprises the circuit of the metal, the insulating substrate, the buffer plate, and the heat spreader member.

In this case, it is preferable that a ratio between a thickness of the circuit of the metal and a total thickness of the buffer plate and the heat spreader member or the heat sink member is 1:0.5 to 1:3 when a coefficient of thermal expansion of the insulating substrate in the first joined unit is smaller than a coefficient of thermal expansion of a material used for the heat spreader member. Accordingly, the first joined unit is warped such that the lower surface of the metal plate is convex-shaped toward the outside. When the heat spreader member is joined or fixed to the lower surface of the metal plate, it is possible to maintain the contact therebetween in a well-suited manner.

It is also preferable that a heat sink member is joined to a lower surface of the heat spreader member using a hard brazing member containing an active element, or a metal plate for making joining to a heat sink member is joined using a hard brazing member containing an active element, and a second joined unit is provided, which comprises the circuit of the metal, the insulating substrate, the buffer plate, and the heat spreader member and the heat sink member or the metal plate and the heat sink member. In this case, the heat sink member may have a shape of fin.

The warpage of the first joined unit or the second joined unit can be controlled by appropriately changing the thickness of the buffer plate. It is preferable that the buffer plate has a thickness of 0.03 to 0.5 mm.

The heat shock characteristics and the coefficient of thermal expansion of the first joined unit or the second joined unit can be controlled by appropriately changing the thickness of the insulating substrate. Especially, it is preferable that the insulating substrate has a thickness of not more than 0.5 mm when the insulating substrate is composed of $Si_3N_4$. It is preferable that the first or second joined unit has a coefficient of thermal conductivity of not less than 200 W/m.

It is preferable to use the hard brazing member composed of Ag—Cu—In—Ti and materials having a melting point of not more than 700° C.

It is preferable that an amount of the active element, which is contained in the hard brazing member to be used for joining at least the circuit of the metal and the insulating substrate, is 0.05 to 2%.

It is preferable that an amount of the active element, which is contained in the hard brazing member to be used for joining the buffer palte and the heat spreader or the heat sink member, is 0.5 to 10%.

It is preferable that a thickness of the hard brazing member to be used for joining the heat spreader member or the heat sink member and the buffer plate, or a thickness of the hard brazing member to be used for joining the heat spreader member or the heat sink member and the metal plate, is not more than 25% of a thickness of the buffer plate. Accordingly, it is possible to enhance the peel strength of the first joined unit or the second joined unit.

It is preferable that a thickness of the hard brazing member to be used for joining the insulating substrate and the circuit of the metal, or a thickness of the hard brazing member to be used for joining the insulating substrate and the buffer plate, is not more than 10% of a thickness of the buffer plate. For example, it is preferable that the thickness of the hard brazing member is not more than 10 μm. Accordingly, a large amount of the brazing member does not stick out during the joining process. Further, the circuit is not polluted (alloyed). Consequently, the subsequent steps are simple for improving the yield and for reducing the production cost.

According to still another aspect of the present invention, there is provided a method for producing a circuit board (first production method), comprising a first step of joining a metal plate onto an insulating substrate using a hard brazing member containing an active metal; a second step of etching the metal plate to form a circuit pattern on the insulating substrate; and a third step of exposing the insulating substrate by removing a conductive reactive layer exposed from at least a metal-removed portion of the circuit pattern to obtain the circuit board having a circuit on the insulating substrate.

According to still another aspect of the present invention, there is provided a method for producing a circuit board (second production method), comprising a first step of forming a circuit pattern for a metal plate; a second step of joining the metal plate onto an insulating substrate using a hard brazing member containing an active metal; and a third step of exposing the insulating substrate by removing a conductive reactive layer exposed from at least a metal-removed portion of the circuit pattern to obtain the circuit board having a circuit on the insulating substrate.

In the second production method, the first step may include a treatment of pressing the metal plate to form the circuit pattern on the metal plate. In this case, the method may further includes a treatment of forming a bridge for connecting parts of the circuit and cutting the bridge after joining the metal plate onto the insulating substrate. The bridge may be formed by half blanking or etching the metal plate.

The metal plate may be joined onto the insulating plate at a temperature of not less than a liquidus curve of the hard brazing member. Alternatively, the metal plate may be joined onto the insulating plate at a temperature of not less than a solidus curve and not more than a liquidus curve of the hard brazing member. Even when any one of the methods is adopted, there is no influence on the heat shock characteristics and the coefficient of thermal conductivity.

In each of the production methods described above, for example, the conductive reactive layer, which remains at the metal-removed portion of the circuit on the insulating substrate, is removed. Therefore, it is possible to obtain the circuit board which is excellent in both of appearance and characteristics.

Especially, in the third step of the first and second production methods, the conductive reactive layer, which is exposed from the metal-removed portion of the circuit pattern, is removed by sandblasting an entire surface including the circuit pattern to expose the insulating substrate. Accordingly, it is possible to easily remove any etching residue such as the conductive reactive layer remaining on the insulating substrate. It is possible to obtain the circuit board which is excellent in both of appearance and characteristics.

In the third step, the conductive reactive layer, which is exposed from the metal-removed portion of the circuit pattern, may be removed by selectively performing a sandblast using a mask to expose the insulating substrate. Alternatively, a plurality of masks may be used, and a treatment, in which the sandblast is selectively performed using each of the masks, and then the conductive reactive layer exposed from windows of the masks and exposed from the metal-removed portion of the circuit pattern is removed, may be repeatedly performed with the plurality of masks.

When the mask is used, the surface of the circuit pattern is not scraped by the blasting abrasive grains. Therefore, it is possible to maintain the surface of the circuit pattern to be a mirror-finished surface. For example, it is possible to adequately join bonding wires in the wiring step to be performed thereafter.

The metal plate may be composed of Cu, Cu alloy, Al, or Al alloy. Further, a plating layer may be formed on the metal plate. In this case, for example, when a semiconductor device, which is mounted on the circuit, is soldered, then the wettability of the solder layer is improved, and the semiconductor device can be reliably mounted on the circuit. It is preferable that the plating layer is an Ni plating layer.

In the first step of the first and second production methods, the metal plate is joined onto the insulating substrate using the hard brazing member containing the active element. In this case, it is possible for the active element to select at least one of elements belonging to any one of Group 2A, Group 3A Group 4A, Group 5A, and Group 4B in the periodic table.

It is preferable that the sandblast in the third step is performed such that at least the circuit pattern remains on the insulating substrate when the insulating substrate is exposed. When a plating layer is formed on the circuit, it is preferable that the sahdblast in the third step is performed such that the plating layer remains on the circuit pattern when the insulating substrate is exposed.

When the conductive reactive layer is generated by a reaction between the insulating substrate and the active element in the hard brazing member, it is necessary that a part of the conductive reactive layer, which corresponds to the metal-removed portion of the circuit pattern, is removed by the sandblast. In this case, it is preferable that the sandblast is performed such that at least the circuit pattern remains on the insulating substrate when the part of the conductive reactive layer corresponding to the metal-removed portion of the circuit is removed. When a plating layer is formed on the circuit pattern, it is preferable that the sandblast is performed such that the plating layer remains on the circuit pattern when the part of the conductive reactive layer corresponding to the metal-removed portion of the circuit pattern is removed.

It is preferable that grains, which are smaller thean mesh #180, are used for the sandblast. It is preferable thet the grains are compsed of $Al_2O_3$ or SiC. Further, it is preferable that an air pressure is 0.1 MPa to 0.25 MPa in the sandblast.

In order to prevent any residual matter of the metal material from remaining between parts of the formed circuit pattern composed of, for example, copper, it is preferable that etching is performed with an aqueous solution of ferric chloride or an aqueous solution of cupric chloride to be normally used when copper is etched, and then a treatment is performed with a solution to effectively etch components of the brazing member.

It is possible for the joining process to use a hard brazing member containing a major component of Ag and containing the active element or the brazing member containing a major component of Ag together with a foil of the active metal. Therefore, it is preferable to perform a treatment with an aqueous solution of ferric nitrate in order to etch Ag.

The waste of the brazing member should be thin. It is preferable that the thickness thereof is not more than 10 μm, more preferably not more than 5 μm by performing, for example, the joining process under an applied pressure, because it is possible to omit the step of removing the brazing member components.

When pressure is applied during the joining process, the stress applied should be sufficient to maintain the flatness of the joining objective during the melting of the brazing member and extrude the excessive brazing member to the outside. To prevent the destruction of the insulating member, it is appropriate to perform the joining process at a stress of 0.1 MPa to 20 MPa, and more preferably 0.5 MPa to 10 MPa.

The velocity of removal of the brazing member component is approximate to the velocity of removal of the copper circuit component during the blasting. However, with the above-mentioned thickness, the copper circuit is suitably removed, even when the brazing member waste remains after the etching with the aqueous solution of ferric chloride or the aqueous solution of cupric chloride. It is possible to remove the brazing member layer and the nitride layer of the active metal.

A plating layer may be stacked on the circuit of the metal plate. Also in this case, when the thickness of the plating layer is not lost by the blasting necessary to remove the residual brazing member waste and the nitride layer of the active metal, it is possible to form the copper circuit with the plating layer in accordance with the same or equivalent treatment.

When Ni plating is performed, the thickness is preferably not less than 2 µm and more preferably not less than 5 µm, considering the remaining brazing member.

Further, in the joining process, it is possible to use the hard brazing member containing a major component of Cu and containing the active element or the brazing member containing a major component of Cu together with a foil of the active metal. In this case, it is possible to perform an etching by only etching with the aqueous solution of ferric chloride or the aqueous solution of cupric chloride without allowing the hard brazing member component to remain.

A heat spreader member or a heat sink member may be joined to a lower portion of the insulating substrate. In this case, a buffer plate of metal may be joined to the lower surface of the insulating substrate using a hard brazing member, and the heat spreader member or the heat sink member may be joined to the lower surface of the buffer plate using a hard brazing member. Further, the metal plate may be joined to the lower surface of the heat spreader member or the heat sink member using a hard brazing member.

When the buffer plate, the heat spreader member or the heat sink member, and the metal plate are joined to the lower portion of the insulating substrate using the hard brazing member respectively, it is desirable to reduce the amount of the brazing member in order to suppress the pollution of the circuit caused by formation of alloy, when Ag—Cu—In—Ti is used as the hard brazing member. However, in such a situation, an absolute amount of necessary Ti is insufficient in some cases. In such a case, it is desirable that a Ti foil is mixed depending on a required amount so that the Ti concentration is increased to effect the joining. Accordingly, it is possible to improve the peel strength as compared with a case in which the Ti foil is not mixed. The required Ti concentration may depend on the material to be joined. However, it is desirable that the concentration is not less than $0.05$ mg/cm$^2$ in the case of the joining of Cu and AlN or Si$_3$N$_4$ of the present invention, or the concentration is not less than $1.5$ mg/cm$^2$ in the case of the joining of a composite material in which a base material of Cu and SiC is impregnated with Cu or Cu alloy or a composite material in which a base material of C is impregnated with Cu or Cu alloy.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 8 shows a table illustrating etching rates for various materials in the sandblast;

FIG. 15 shows a table illustrating results of a first illustrative experiment (heat cycle test for Comparative Example 1 and Examples 1 to 3);

FIG. 20 shows a table illustrating results of a third illustrative experiment (illustrative experiment to observe the heat cycle, the coefficient of thermal conductivity of the circuit board, and the insulation performance of the insulating substrate for Comparative Example 5 and Examples 3 to 6);

FIG. 22 shows a table illustrating results of a fifth illustrative experiment (illustrative experiment to observe the change of the amount of warpage of the circuit board depending on the thickness of the circuit);

FIG. 24 shows a table illustrating results of a sixth illustrative experiment (illustrative experiment to observe the change of the amount of warpage of the circuit board depending on the thickness of the buffer plate);

FIG. 28 shows characteristics illustrating results of a ninth illustrative experiment (illustrative experiment to observe the difference in heat cycle and coefficient of thermal conductivity depending on the joining temperature for Examples 34 to 36);

FIG. 30 shows a table illustrating results of an eleventh illustrative experiment (illustrative experiment to observe the difference in pollution state of the circuit, peel strength, heat cycle, and coefficient of thermal conductivity depending on the thickness of each of first to fourth brazing members for Comparative Examples 8 to 10 and Examples 41 to 43);

FIG. 31 shows a table illustrating results of a twelfth illustrative experiment (illustrative experiment to observe the difference in peel strength, heat cycle, and coefficient of thermal conductivity depending on the amount of the active element in each of first to fourth brazing members for Comparative Example 11 and Examples 44 to 46);

FIG. 32 shows a table illustrating results of a thirteenth illustrative experiment (illustrative experiment to observe the difference in tight contact performance of bonding wire with respect to the circuit (or the plating layer) depending on the specular reflection of the circuit (or the plating layer) for Comparative Example 12 and Examples 47 to 53);

DETAILED DESCRIPTION OF THE INVENTION

Illustrative embodiments of the circuit board and the method for producing the same according to the present invention will be explained below with reference to FIGS. 1 to 35.

Figure 1:
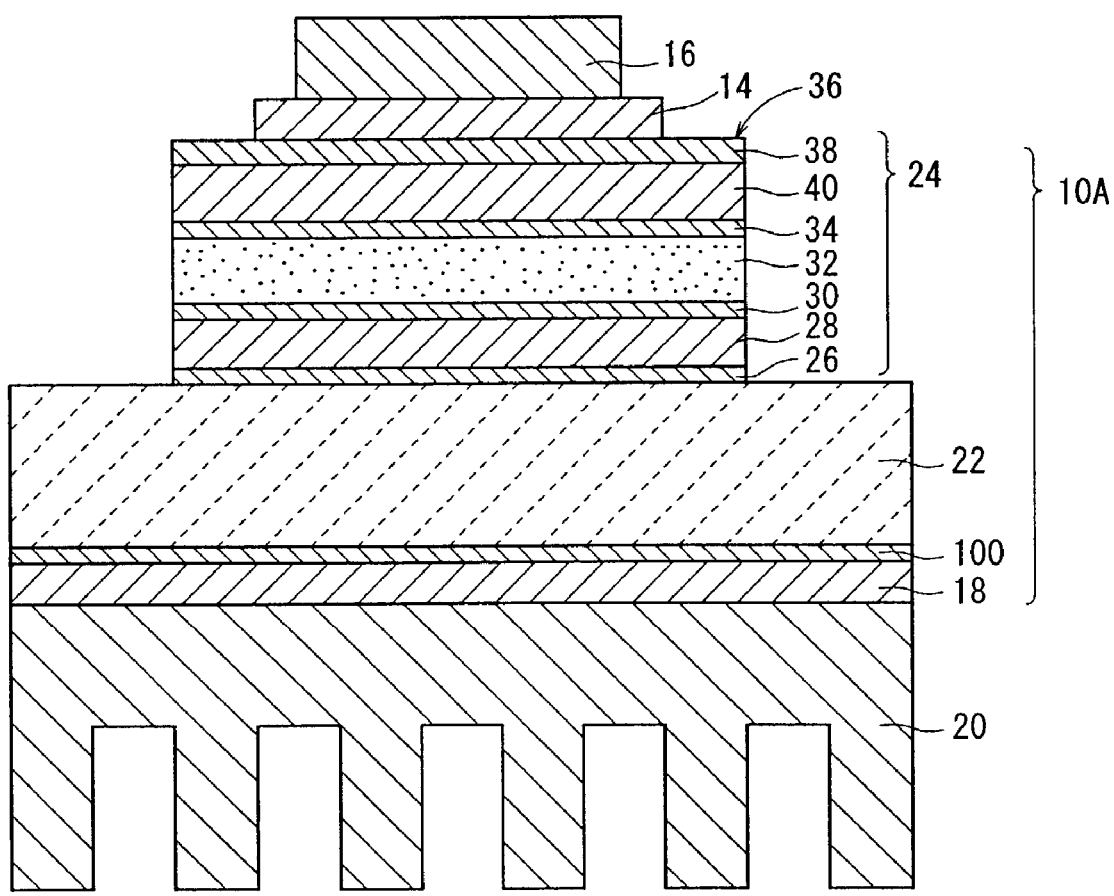
FIG. 1 is a vertical sectional view illustrating a circuit board according to a first embodiment and an electronic part using the circuit board.

At first, as shown in FIG. 1, an electronic part 12A having a circuit board 10A according to a first embodiment comprises a semiconductor device 16 which is mounted on the circuit board 10A with a solder layer 14 interposed therebetween, and a cooling fin 20 which is fixed to the lower surface of the circuit board 10A with a metal plate 18 interposed therebetween.

The circuit board 10A according to the first embodiment comprises a thermal conductive layer 24 which is provided on a heat spreader member 22.

The thermal conductive layer 24 comprises a buffer plate (Cu or the like) 28 made of metal which is joined onto the heat spreader member 22 with a first brazing member 26 containing an active element interposed therebetween, an insulating substrate 32 which is joined onto the buffer plate 28 with a second brazing member 30 containing an active element interposed therebetween, and a circuit 36 of a circuit-forming metal plate which is joined onto the insulating substrate 32 with a third brazing member 34 interposed therebetween. The metal plate 18 (Cu or the like) is joined to the lower surface of the heat spreader member 22 with a fourth brazing member 100 interposed therebetween.

In this embodiment, the circuit 36 is manufactured such that the circuit-forming metal plate 40, which is composed of, for example, Cu or Al and which has an Ni plating layer 38 formed on the upper surface, is subjected to press working or etching treatment along a predetermined circuit pattern.

An AlN layer or an $Si_3N_4$ layer can be used for the insulating substrate 32. When the AlN layer is used for the insulating substrate 32, the coefficient of thermal expansion of the AlN layer is approximately within a range of $3.0 \times 10^{-6}$ to $1.0 \times 10^{-5}$ /K, although the coefficient of thermal expansion of the AlN layer changes depending on the molar composition ratio of Al and N. Therefore, it is preferable that the coefficient of thermal expansion of the heat spreader member 22 is $3.0 \times 10^{-6}$ to $1.0 \times 10^{-5}$ /K, for the following reason. If the coefficient of thermal expansion of the insulating substrate 32 is $3.0 \times 10^{-6}$ /K, and the coefficient of thermal expansion of the heat spreader member 22 exceeds $1.0 \times 10^{-5}$ /K, then the heat spreader member 22 and the insulating substrate 32 may be peeled off or exfoliated from each other, when the temperature of the electronic part 12A in use is raised.

It is preferable that the molar composition ratio of Al to N in the insulating substrate 32 is Al:N=0.8:1.2 to 1.2:0.8, for the following reason. When such a molar composition ratio is adopted, the insulating substrate 32 reliably exhibits a coefficient of thermal expansion of $3.0 \times 10^{-6}$ to $1.0 \times 10^{-5}$ /K and a coefficient of thermal conductivity of not less than 150 W/mK.

It is preferable that the coefficient of thermal conductivity of the heat spreader member 22 is not less than 150 W/mK, for the following reason. If the coefficient of thermal conductivity is less than 150 W/mK, the heat, which is generated by the semiconductor device 16 as the electronic part 12A is used, is transmitted at a slow speed to the outside of the electronic part 12A. As a result, a poor effect is obtained to maintain a constant temperature of the electronic part 12A.

The constitutive material for the heat spreader member 22 is not specifically limited provided that the coefficient of thermal conductivity and the coefficient of thermal expansion are within the ranges described above. However, the constitutive material for the heat spreader member 22 is preferably exemplified by at least one selected from the group consisting of SiC, AlN, $Si_3N_4$, BeO, $Al_2O_3$, $Be_2C$, C, Cu, Cu alloy, Al, Al alloy, Ag, Ag alloy, and Si. That is, the heat spreader member 22 can be constructed with a simple substance selected from the above, or a composite material composed of two or more of the above. The composite material can be exemplified by an SiC/Cu composite material 22A (see FIG. 2) and a C/Cu composite material 22B (see FIG. 3).

Figure 2:
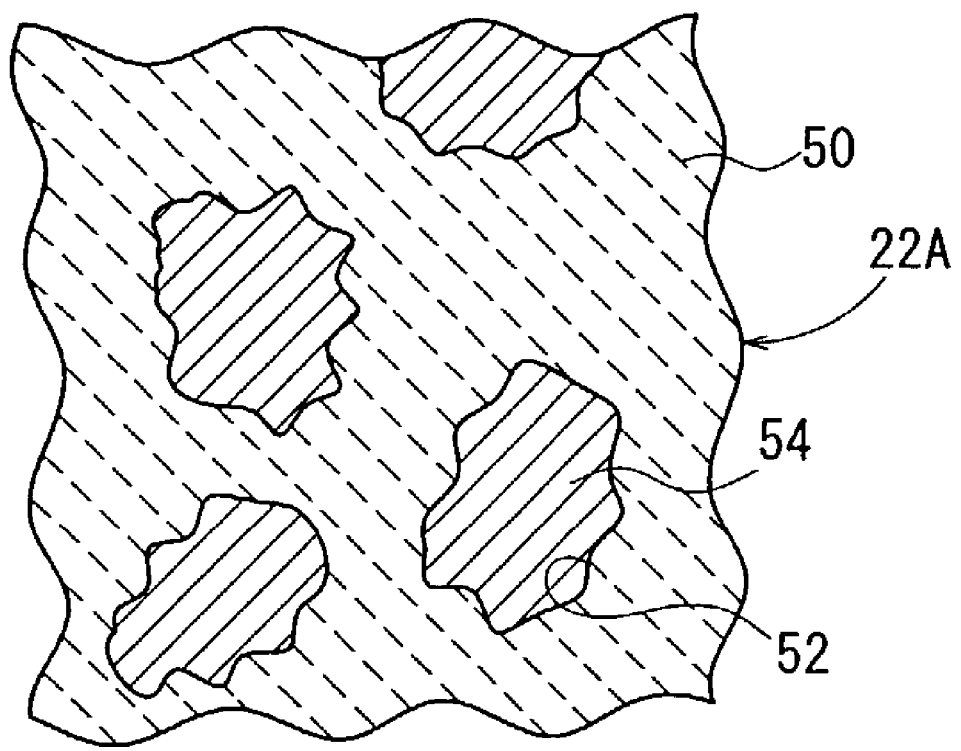
FIG. 2 is a magnified view illustrating a composite material of SiC/Cu as an example of the constitutive material for a heat sink member.

As shown in FIG. 2, the SiC/Cu composite material 22A is obtained by impregnating open pores 52 of a porous sintered matter 50 composed of SiC with melted Cu or Cu alloy 54, and then solidifying the Cu or Cu alloy 54.

Figure 3:
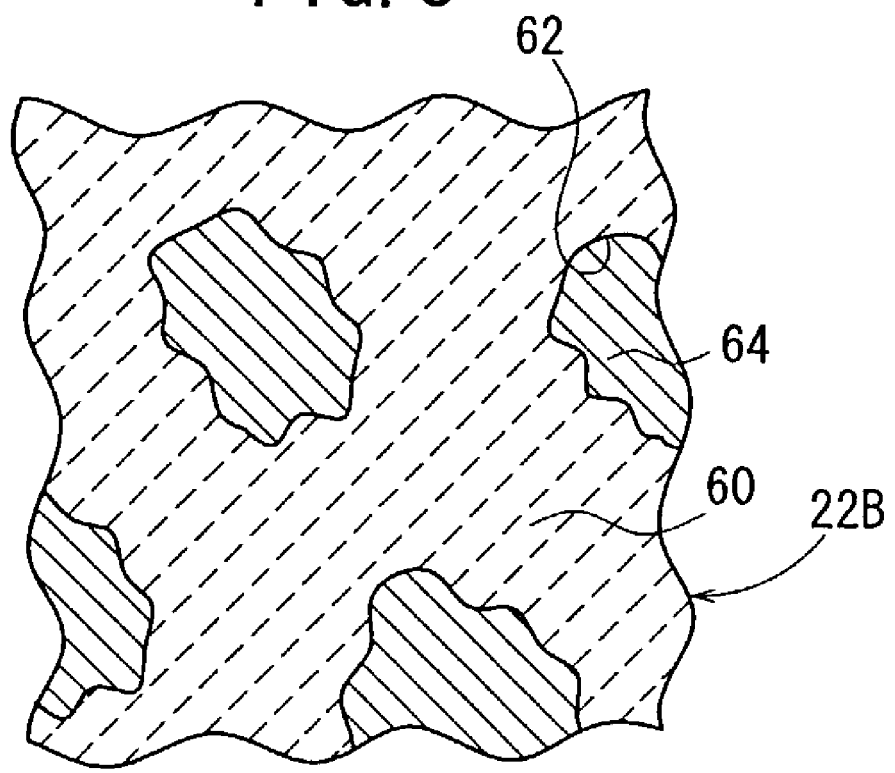
FIG. 3 is a magnified view illustrating a composite material of C/Cu as another example of the constitutive material for the heat sink member.

As shown in FIG. 3, the C/Cu composite material 22B is obtained by impregnating open pores 62 of a porous sintered matter 60 obtained by preliminarily sintering carbon or allotrope thereof to form a network, with melted Cu or Cu alloy 64, and then solidifying the Cu or Cu alloy 64. For example, the C/Cu composite material 22B is a member as disclosed in Japanese Patent Application No. 2000-80833.

When the heat spreader member 22 is composed of the composite material or the alloy as described above, the coefficient of thermal expansion and the coefficient of thermal conductivity can be controlled to be within the ranges as described above (coefficient of thermal expansion: $3.0 \times 10^{-6}$ to $1.0 \times 10^{-5}$ /K, coefficient of thermal conductivity: not less than 150 W/mK) by establishing the composition ratio of the constitutive components.

It is preferable that each of the first to fourth brazing members 26, 30, 34, 100 is a hard brazing member containing an active element. In this case, as for the active element, it is possible to use at least one of elements belonging to Group 2A in the periodic table including, for example, Mg, Sr, Ca, Ba, and Be; Group 3A including, for example, Ce, Group 4A including, for example, Ti, Zr, and Hf; Group 5A including, for example, Nb and Ta, and Group 4 including, for example, B and Si. In the first embodiment, a hard brazing member of Ag—Cu—Ti or a hard brazing member of Ag—Cu—In—Ti or Cu—Al—Si—Ti is used for the first to third brazing members 26, 30, 34. In this case, the active element is Ti.

When the circuit board 10A according to the first embodiment is used, the heat sink member 20, which is composed of, for example, Al or Cu, is fixed, for example, by means of screw fastening (not shown) to the lower surface of the metal plate 18. As shown in the drawings, the cooling fin is generally provided as the heat sink member 20, which is a member for dissipating the heat by means of water cooling or air cooling.

Figure 4:
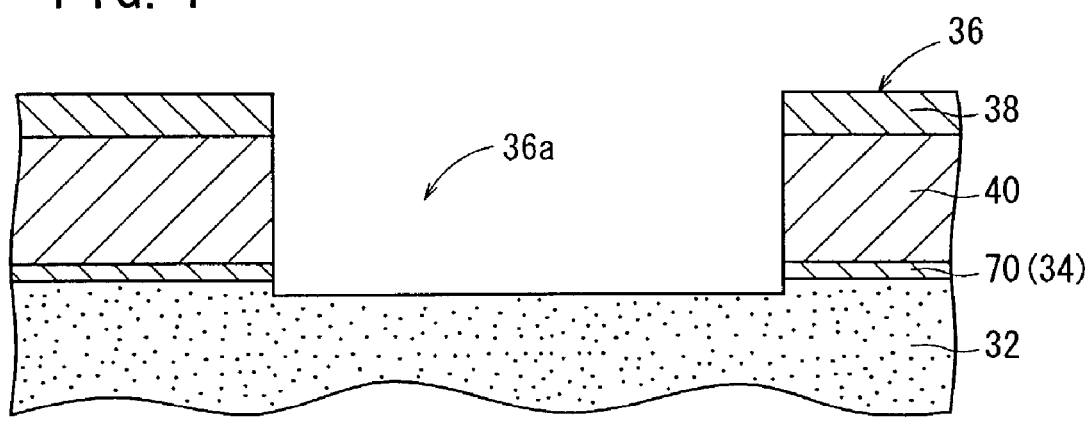
FIG. 4 is a magnified sectional view illustrating a part of a circuit and an insulating substrate of the circuit board according to the first embodiment.

As shown in a magnified view in FIG. 4, in the circuit board 10A according to the first embodiment, the circuit 36 is formed by means of the following two types of methods. That is, in the first method, the circuit 36 is formed by means of an etching treatment and a sandblast treatment for the circuit-forming metal plate 40 which is joined onto the insulating substrate 32 with the third brazing member 34 interposed therebetween. In the second method, the circuit-forming metal plate 40, on which a circuit pattern is previously formed (indicating that metal portions other than the circuit 36 are not completely removed, and portions to be converted into the circuit 36 thereafter are depicted as a pattern), is joined onto the insulating substrate 32 with the third brazing member 34 interposed therebetween, and then a sandblast treatment is performed for the circuit-forming metal plate 40 to form the circuit 36.

The circuit 36 includes a metal-removed portion 36a which is constructed such that the underlying insulating substrate 32 is exposed. When the insulating substrate 32 and the circuit 36 are joined, a conductive reactive layer 70 is generated between the insulating substrate 32 and the circuit 36 as a result of a reaction between the third brazing member 34 and the insulating substrate 32. Therefore, in FIG. 4 the reference numeral 34 to indicate the third brazing member is shown with parentheses.

Several methods for producing the circuit board 10A according to the first embodiment will now be explained with reference to FIGS. 5A to 14D.

Figure 5A:
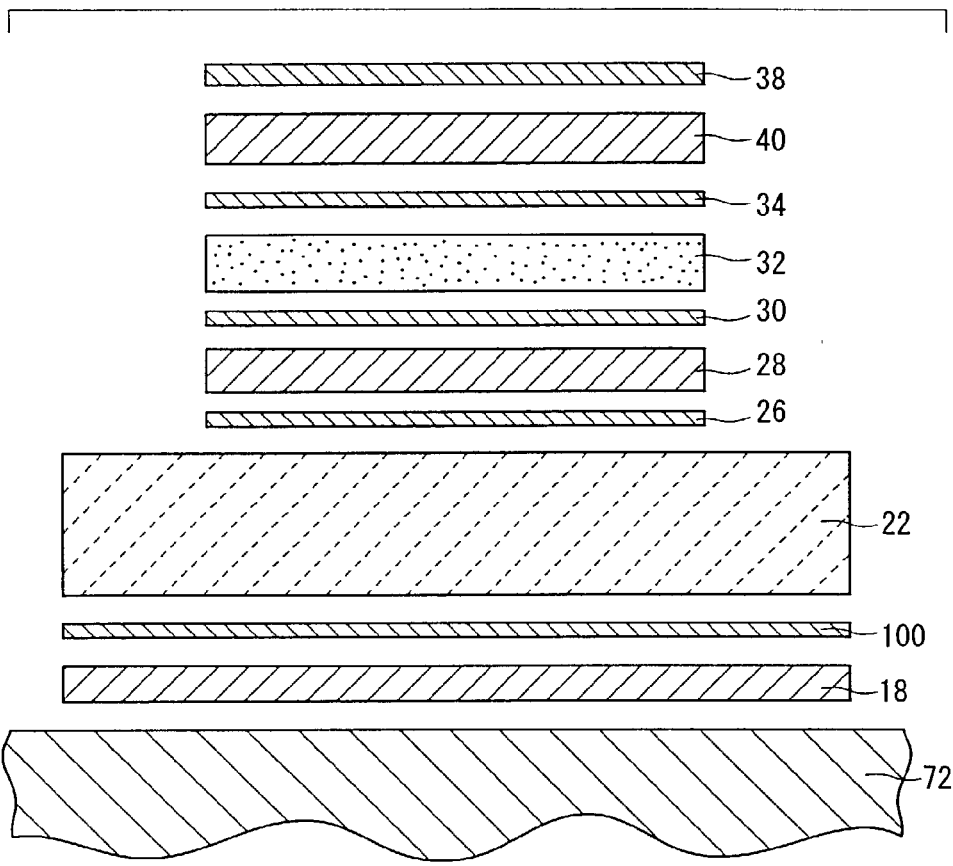
FIG. 5A illustrates a setting step.

At first, the first production method includes a setting step shown in FIG. 5A, in which the metal plate 18, the fourth brazing member 100, the heat spreader member 22, the first brazing member 26, the buffer plate 28, the second brazing member 30, the insulating substrate 32, the third brazing member 34, and the circuit-forming metal plate 40 plated with the Ni plating layer 38 on the upper surface are placed (subjected to setting) in this order on a jig 72, and the components are fixed on the jig 72. The setting is performed, for example, in the atmospheric air.

Subsequently, in a joining step shown in FIG. 5B, the metal plate 18, the fourth brazing member 100, the heat spreader member 22, the first brazing member 26, the buffer plate 28, the second brazing member 30, the insulating substrate 32, the third brazing member 34, and the circuit-forming metal plate 40, which are fixed on the jig 72, are pressurized vertically, for example, in vacuum of not more than $1.0 \times 10^{-5}$ Torr, while the components are joined to one another by raising/lowering the temperature. As a result of the joining treatment, a joined unit is obtained, in which the circuit-forming metal plate 40, the insulating substrate 32, the buffer plate 26, heat spreader member 22, and the metal plate are integrated into one unit.

The pressure is applied in the joining step preferably at a force or stress of not less than 0.1 MPa and not more than 20 MPa, and more preferably not less than 0.5 MPa and not more than 10 MPa for the following reason. If the stress is not more than the value as described above, then the brazing member layer remains, and the brazing member may be an obstacle upon removal. On the other hand, if the stress is not less than the value as described above, excessive load may be applied to the insulating substrate 32. Especially, in the joining operation, for example, as shown in FIG. 6A, the conductive reactive layer 70 (TiN layer) is formed between the metal plate 40 and the insulating substrate 32 by the reaction between the active metal (Ti in this case) of the third brazing member 34 and the insulating substrate 32 (AlN or $Si_3N_4$).

Figure 6A:
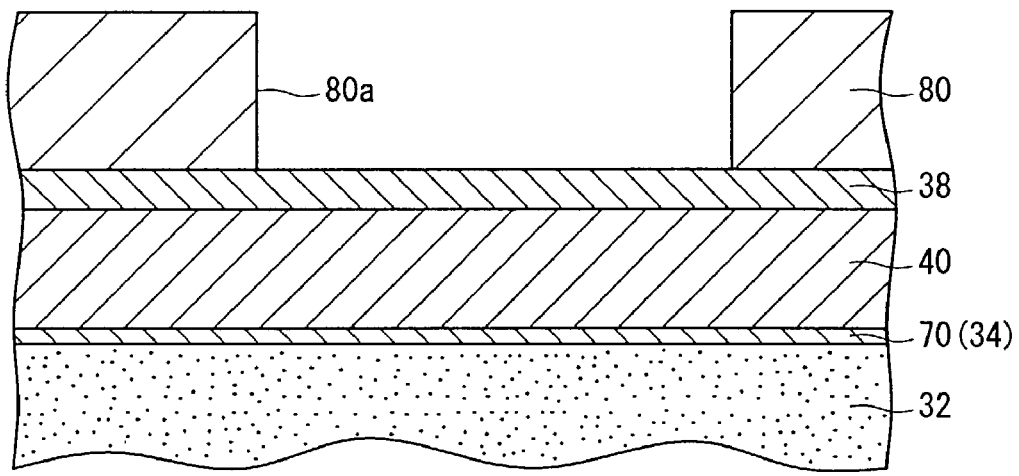
FIG. 6A illustrates a resist-forming step.
Figure 6B:
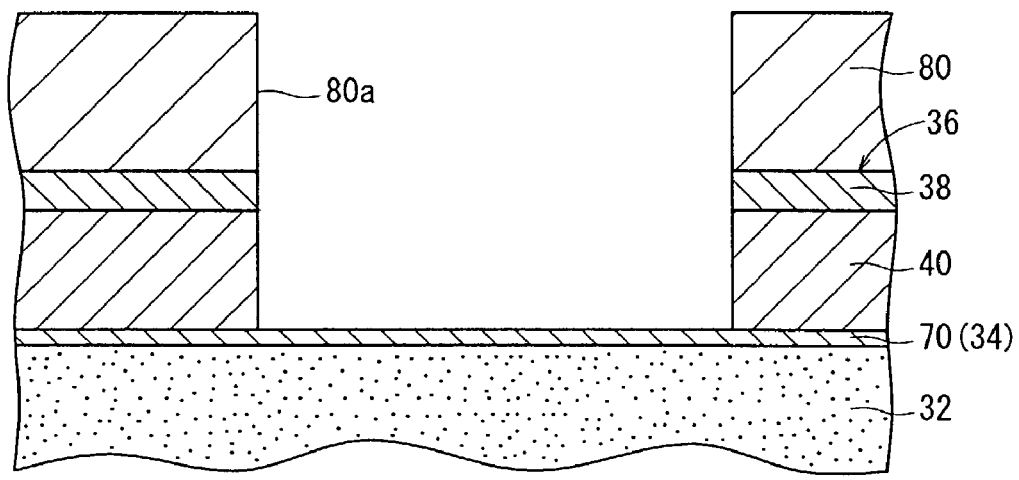
FIG. 6B illustrates an etching step.

After that, as shown in FIGS. 6A and 6B, an etching treatment is applied to the circuit-forming metal plate 40 along a predetermined circuit pattern to form the circuit 36. Specifically, as shown in FIG. 6A, a circuit-forming resist 80 is printed on the entire surface of the circuit-forming metal plate 40. Only portions, which are not subjected to the etching, are selectively cured for the resist 80. Subsequently, non-cured portions are removed to form windows 80a (resist-forming step). The portions, on which the resist 80 remains, are formed into the circuit pattern.

After that, as shown in FIG. 6B, the Ni plating 38 as a portion of the Ni plating layer 38 formed on the upper surface of the metal plate 40, exposed from the window 80a of the resist 80 and the metal plate 40 are subjected to an etching treatment with an aqueous solution of ferric chloride or an aqueous solution of cupric chloride to form the circuit 36. It is preferable that an etching treatment is thereafter performed with an aqueous solution of ferric nitrate when any brazing member containing a major component of Ag is used, in order to completely remove the brazing member remaining between parts of the circuit 36 (etching treatment step).

Figure 7:
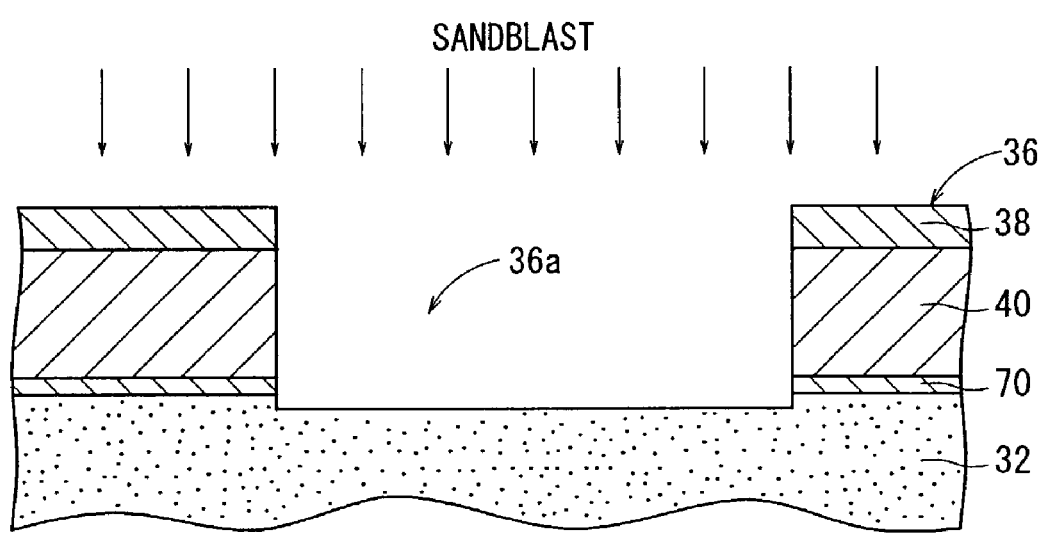
FIG. 7 illustrates a sandblast step.

After that, as shown in FIG. 7, the resist 80 on the circuit 36 is removed, and then a sandblast treatment is applied to the entire surface including the circuit 36 to remove the conductive reactive layer 70 remaining at the metal-removed portion 36a of the circuit 36. Accordingly, the underlying insulating substrate 32 is exposed from the metal-removed portion 36a of the circuit 36.

In this case, it is preferable that the sandblast treatment is performed under a condition in which the Ni plating layer 38 remains on the circuit 36 at the stage at which the conductive reactive layer 70 remaining at the metal-removed portion 36a of the circuit 36 is removed.

In this embodiment, the grains, which are finer than mesh #180 and which are composed of $Al_2O_3$ or SiC, are used for the sandblast treatment. The air pressure is 0.1 MPa to 0.25 MPa in the sandblast treatment. The thickness of the Ni plating layer 38 is not less than 2 μm. The diameter of the grain corresponding to mesh #180 can be represented by the maximum diameter of the grain which passes through mesh #180. In this case, the diameter is 85 μm. Therefore, it is preferable to use grains having a grain diameter of not more than 85 μm.

The etching rate will now be specifically explained for a variety of materials for the sandblast treatment. At first, the etching rate was measured by using $Al_2O_3$ grains having a fineness of mesh #240 as grains to be used for the sandblast treatment and using air pressures of 0.1 MPa and 0.25 MPa. Results were obtained as shown in FIG. 8.

That is, when the air pressure was 0.25 MPa, then the etching rate for AlN as a constitutive material for the insulating substrate 32 was 13 μm/sec, and the etching rate for $Si_3N_4$ as a constitutive material for the insulating substrate 32 was 2.7 μm/sec. Similarly, the etching rate for Cu as a constitutive material for the circuit 36 was 1.5 μm/sec, the etching rate for Ni as a constitutive material for the Ni plating layer 38 on the circuit 36 was 2 μm/sec, the etching rate for Ag—Cu—Ti as a brazing member was 1.6 μm/sec, and the etching rate for TiN as a constitutive material for the conductive reactive layer 70 was 10 μm/sec.

The thickness of the conductive reactive layer 70, which is generated between the metal plate 40 and the insulating substrate 32, is about 2 to 5 μm at most. Therefore, when the Ni plating layer 38 on the metal plate 40 has a thickness of not less than 2 μm, then the conductive reactive layer 70, which remains at the metal-removed portion 36a of the circuit 36, can be reliably removed by means of the sandblast treatment for 1 second, and the Ni plating layer 38 is allowed to remain on the circuit 36. Considering the stability of operation, it is preferable that the thickness of the Ni plating layer 38 is not less than 5 μm.

Similarly, when the air pressure was 0.1 MPa, then the etching rate for AlN as a constitutive material for the insulating substrate 32 was 4.8 μm/sec, and the etching rate for $Si_3N_4$ as a constitutive material for the insulating substrate 32 was 1.4 μm/sec. Similarly, the etching rate for Cu as a constitutive material for the circuit 36 was 0.8 μm/sec, the etching rate for Ni as a constitutive material for the Ni plating layer 38 on the circuit 36 was 1.2 μm/sec, the etching rate for Ag—Cu—Ti as a brazing member was 0.9 μm/sec, and the etching rate for TiN as a constitutive material for the conductive reactive layer 70 was 3 μm/sec.

Also in this case, the conductive reactive layer 70, which remains at the metal-removed portion 36a of the circuit 36, can be reliably removed by means of the sandblast treatment for about 2 seconds, and the Ni plating layer 38 is allowed to remain on the circuit 36.

Figure 9:
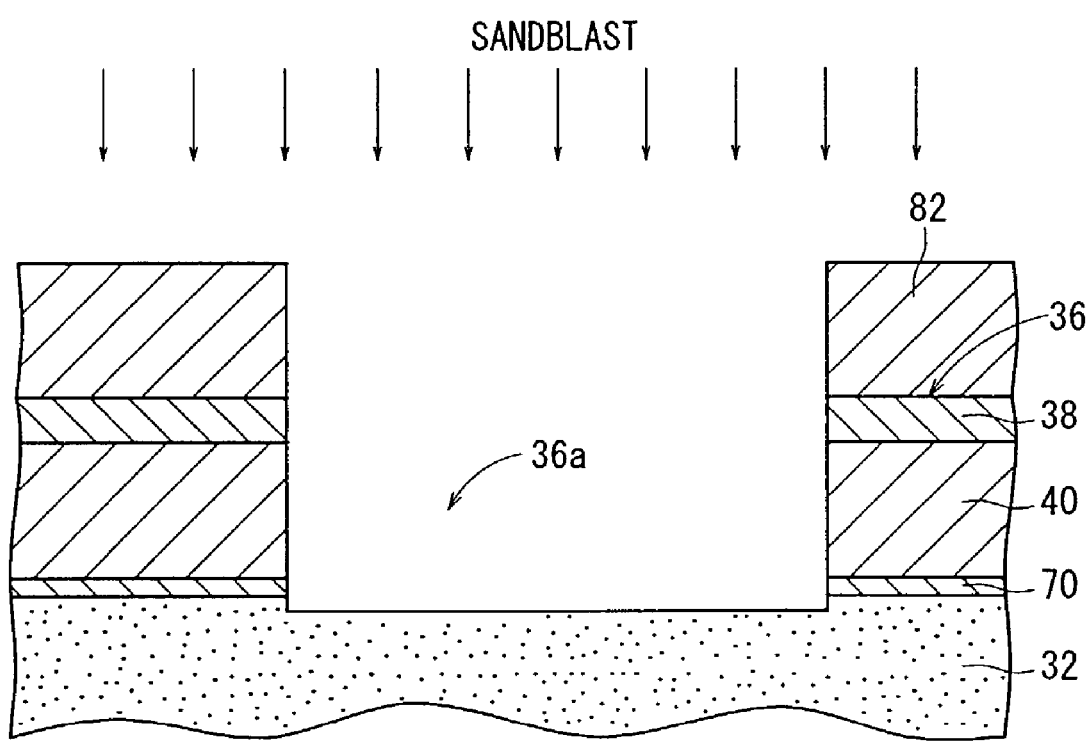
FIG. 9 illustrates another example of the sandblast step.

Of course, as shown in FIG. 9, a mask 82 may be installed on the circuit 36. The portion, which is exposed through the mask 82, i.e., the conductive reactive layer 70 remaining at the metal-removed portion 36a of the circuit 36, may be removed by means of the sandblast treatment.

Figure 10A:
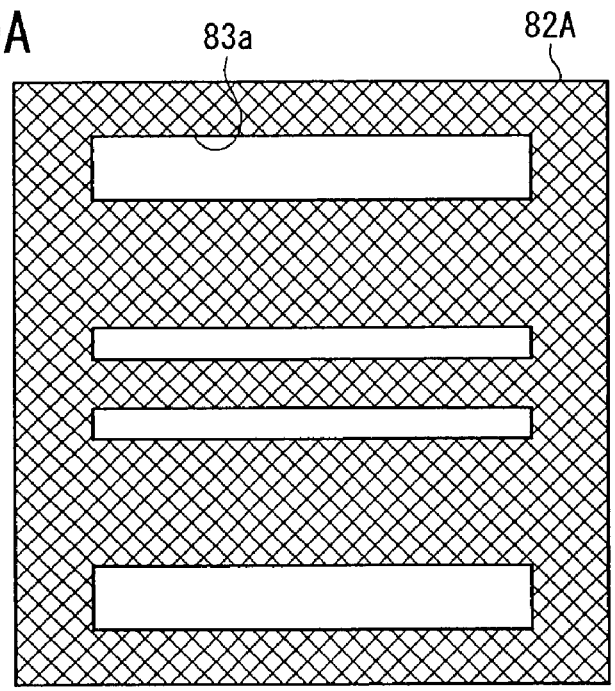
FIG. 10A is a plan view illustrating a first mask.
Figure 10B:
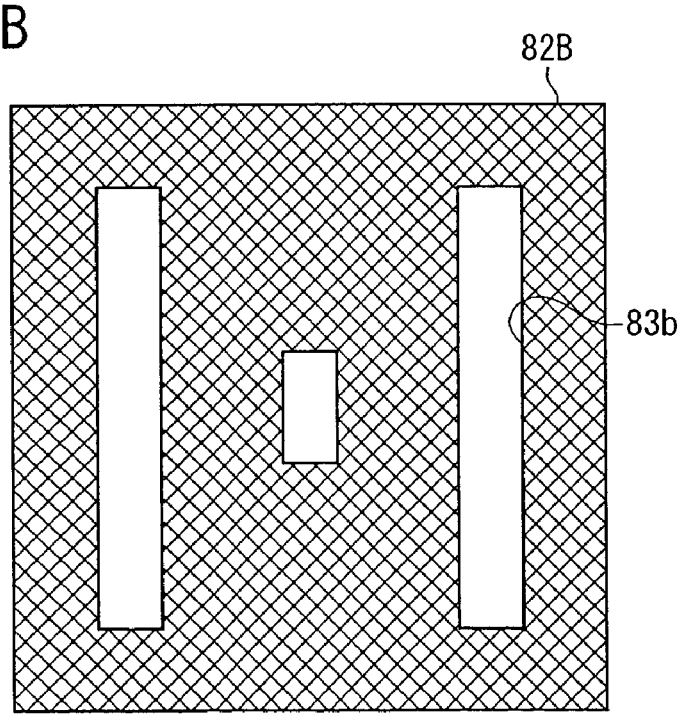
FIG. 10B is a plan view illustrating a second mask.

In this case, for example, as shown in FIGS. 10A and 10B, a plurality of masks 82A, 82B may be used. The sandblast treatment may be selectively performed by the masks 82A, 82B. The first mask 82A shown in FIG. 10A has, for example, windows 83a formed along horizontal ruled lines. The second mask 82B shown in FIG. 10B has, for example, windows 83b formed along vertical ruled lines.

Figure 11A:
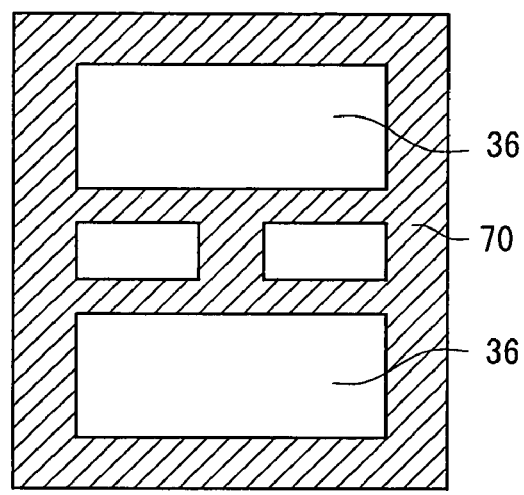
FIG. 11A shows an example of a planar pattern of a circuit after the etching.

A pattern shown in FIG. 11A is assumed as a planar pattern of the circuit 36 after the etching treatment. In FIG. 11A, an area indicated by hatched lines represents an area in which the conductive reactive layer 70 is exposed.

Figure 11B:
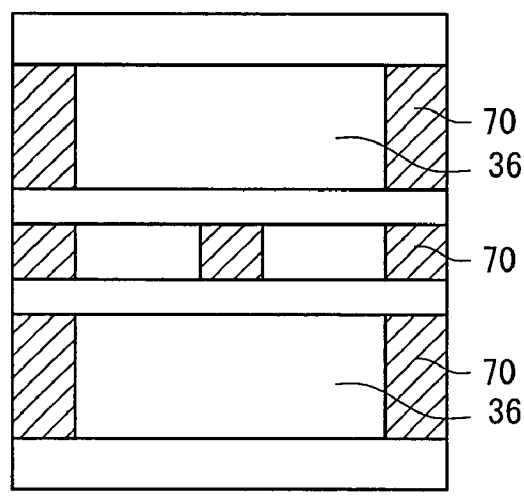
FIG. 11B shows a planar pattern of the circuit after performing the sandblast using the first mask.

At first, the first mask 82A shown in FIG. 10A is used to perform the sandblast treatment. As a result of this treatment, portions of the exposed conductive reactive layer 70, which correspond, for example, to the windows 83a of the first mask 82A, are removed as shown in FIG. 11B. During this process, the portions of the circuit 36 are prevented from collision of the grains (grains used in the sandblast treatment) by the first mask 82A.

Figure 11C:
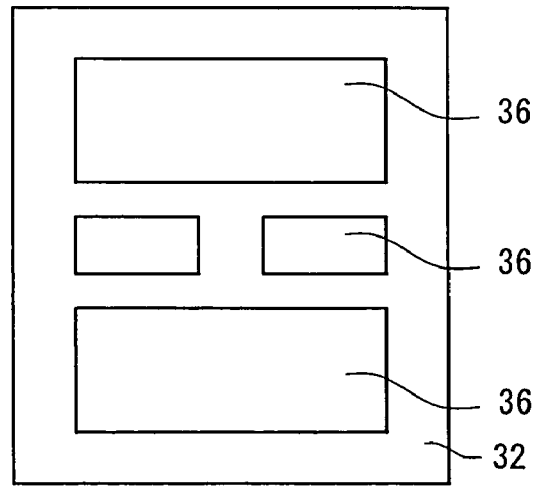
FIG. 11C shows a planar pattern of the circuit after performing the sandblast using the second mask.

After that, the sandblast treatment is performed using the second mask 82B shown in FIG. 10B. Accordingly, portions, which correspond to the windows 83b of the second mask 82B, are removed. That is, as shown in FIG. 11C, all of the conductive reactive layer 70, which has been exposed from the metal-removed portion of the circuit 36, is removed. Consequently, the insulating substrate is exposed from the metal-removed portion of the circuit 36. Also in this case, the portions of the circuit 36 are prevented from collision of the grains (grains used in the sandblast treatment) by the second mask 82B.

It is preferable that each of the first and second masks 82A, 82B is composed of a material such as stainless steel, preferably having a thickness of 0.3 to 1.0 mm. Accordingly, each of the first and second masks 82A, 82B maintains the original planar shape even when the sandblast treatment is completed, making it possible to sufficiently function as a mask for the sandblast treatment.

When the sandblast treatment is performed using the mask as described above, it is possible to reliably remove the conductive reactive layer 70 remaining at the metal-removed portion 36a of the circuit 36. Further, the surface roughness can be maintained without exerting any influence of the sandblast treatment on the Ni plating layer 38 on the circuit 36.

Subsequently, as shown in FIG. 1, the semiconductor device 16 is mounted on the circuit 36 using the solder layer 14. Thus, the electronic part 12A is obtained. In the first embodiment, for example, a commercially available silicon-based IGBT (power semiconductor element) was joined with a low melting point solder. Further, although not shown, metal wires (bonding wires) were electrically connected to terminals of the semiconductor device 16 by wire bonding. Similarly, metal wires were also connected to the circuit 36.

After that, the circuit board 10A, to which the semiconductor device 16 was joined, was accommodated in a package. A commercially available silicone gel for potting was injected into the package, and cured. Accordingly, the electric insulation performance of the circuit board 10A is enhanced, and the mechanical reliability thereof is secured.

Next, the second production method will be explained with reference to FIGS. 12A to 14D. The second production method is different from the first production method described above in that a circuit-forming metal plate 40, on which a circuit pattern is previously formed, is joined onto the insulating substrate 32. The method for previously forming the circuit pattern on the circuit-forming metal plate 40 includes a method based on press forming and a method based on etching. In FIGS. 12A to 14D, the plating layer 38 formed on the circuit-forming metal plate 40 is omitted from the illustration.

Figure 12A:
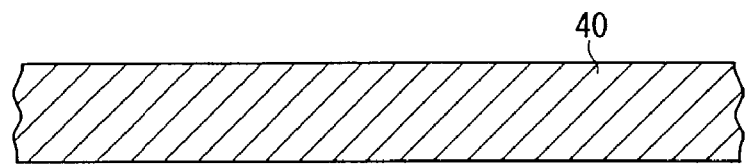
FIGS. 12A to 12E show steps illustrating an example of a method based on press forming in a second production method.

At first, the method based on the press working will be explained. A circuit-forming metal plate 40 is prepared as shown in FIG. 12A. After that, as shown in FIG. 12B, half blanking machining is performed for the circuit-forming metal plate 40 so that a circuit pattern 102 is formed, and arc-shaped bridges 106, which connect portions 104 to be converted into the circuit thereafter, are formed.

Figure 12B:
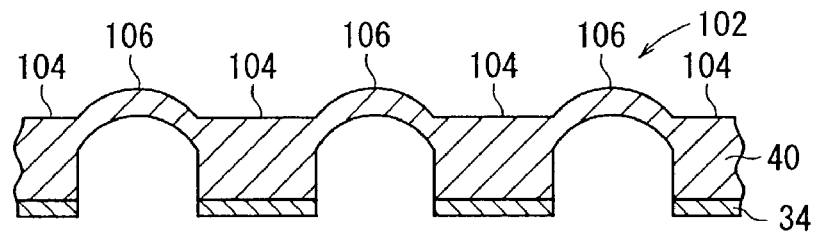

In this procedure, as shown in FIG. 12B, the brazing member 34 may be applied to the lower surfaces of the portions of the circuit-forming metal plate to be converted into the circuit thereafter. The brazing member may be applied as follows. That is, a paste of brazing member may be applied. Alternatively, a plate-shaped brazing member or a brazing member in powder form may be applied or stuck with an adhesive.

Figure 12C:
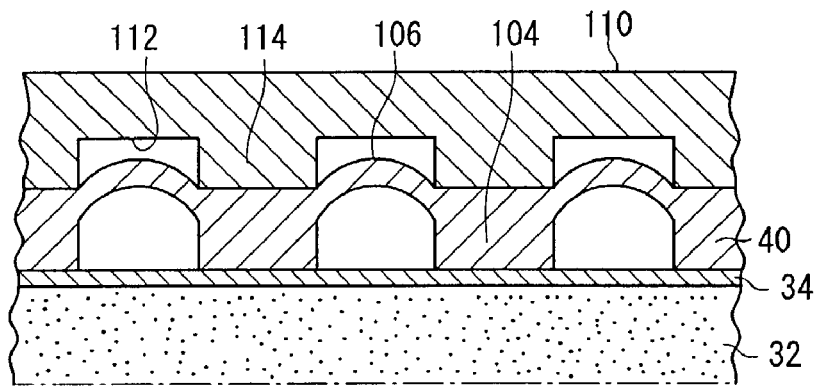

After that, as shown in FIG. 12C (see FIG. 5A), the metal plate 18, the fourth brazing member 100, the heat spreader member 22, the first brazing member 26, the buffer plate 28, the second brazing member 30, the insulating substrate 32, the third brazing member 34, and the circuit-forming metal plate 40 are placed (subjected to setting) in this order on the jig 72, and the components are fixed on the jig.

In this procedure, when the brazing member 34 is already applied to the lower surfaces of the portions to be converted into the circuit thereafter as shown in FIG. 12B, it is unnecessary to newly prepare the third brazing member 34 as shown in FIG. 12C. The circuit-forming metal plate 40, in which the brazing member 34 has been applied to the lower surfaces, may be directly placed on the insulating substrate 32.

FIG. 12C shows a state in which the circuit-forming metal plate 40, in which the brazing member 34 is not applied to the lower surfaces of the portions to be converted into the circuit thereafter, is placed and fixed on the insulating substrate 32 while the third brazing member 34 is disposed between the insulating substrate 32 and the circuit-forming metal plate 40.

After that, a jig 110 (protecting jig) for protecting the bridges 106 is placed on the circuit-forming metal plate 40. The protecting jig 110 has, for example, a shape of rectangular parallelepiped or cube which has an areal size of such an extent that the circuit-forming metal plate 40 is covered therewith in plan view. The protecting jig 110 has recesses 112 which is open downwardly at portions corresponding to the circular arc-shaped bridges 106. Further, the protecting jig 110 is configured so that portions 114 other than the recesses 112 contact with the portions 104 to be converted into the circuit thereafter.

After that, the metal plate 18, the fourth brazing member 100, the heat spreader member 22, the first brazing member 26, the buffer plate 28, the second brazing member 30, the insulating substrate 32, the third brazing member 34, and the circuit-forming metal plate 40, which are fixed on the jig 72 (see FIG. 5), are pressurized vertically, for example, in vacuum of not more than $1.0 \times 10^{-5}$ Torr, while the components are joined to one another by raising/lowering the temperature. During this process, the circuit-forming metal plate 40 is covered with the protecting jig 110. Therefore, the bridges 106 are neither deformed nor cut when the pressure is applied. Thus, it is possible to reliably make tight contact of the circuit-forming metal plate 40 with the insulating substrate 32, and it is possible to avoid any occurrence of positional discrepancy for each of the portions of the circuit-forming metal plate 40 to be converted into the circuit thereafter.

Figure 12D:
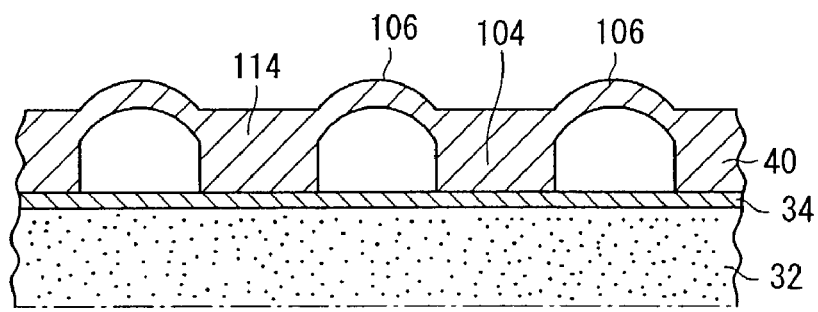
Figure 12E:
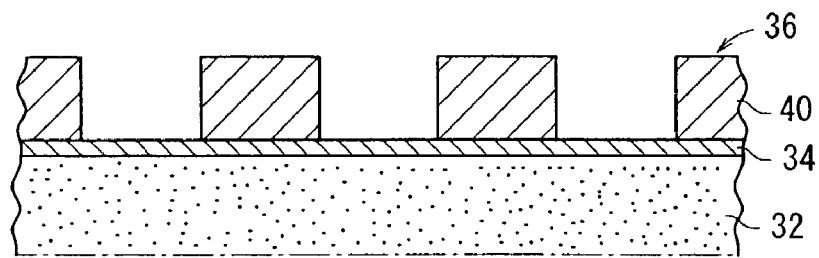

After that, the protecting jig 110 is removed as shown in FIG. 12D, and then the bridges 106 are cut and removed, for example, with nippers as shown in FIG. 12E. Thus, the circuit 36 of the circuit-forming metal plate 40 is formed on the insulating substrate 32. In order to achieve the object as described above, it is sufficient that the bridges 106 are provided at necessary sites at which the respective portions of the circuit-forming metal plate 40 to be converted into the circuit thereafter do not cause any positional discrepancy. All of the sites other than the respective portions to be converted into the circuit thereafter do not necessarily have the shape of bridge.

After that, in the same manner as in the first production method described above, the sandblast treatment is performed for the entire surface including the circuit 36 or using the mask 82. Thus, the conductive reactive layer 70, which is exposed from the metal-removed portion 36a of the circuit 36, is removed.

Next, explanation will be made with reference to FIGS. 13A to 14D for several modified embodiments of the second production method described above.

Figure 13A:
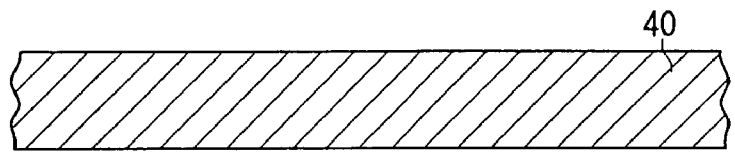
FIGS. 13A to 13E show steps illustrating another example of a method based on press forming in the second production method.
Figure 13B:
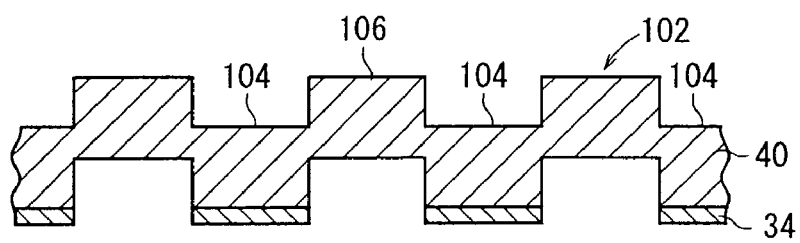

At first, in the production method according to the first modified embodiment, when the circuit is formed by press working for the circuit-forming metal plate 40 as shown in FIG. 13B after preparing the circuit-forming metal plate 40 as shown in FIG. 13A, half blanking machining is firstly performed for the circuit-forming metal plate 40. As a result of the half blanking machining, a circuit pattern 102 is formed, and bridges 106, which connect portions 104 to be converted into the circuit thereafter, are formed. In an example shown in FIG. 13B, the bridges 106 are lifted upwardly as compared with the portions 104 to be converted into the circuit thereafter. After that, an adhesive is applied to the lower surfaces of the portions to be converted into the circuit thereafter, of the circuit-forming metal plate.

Figure 13C:
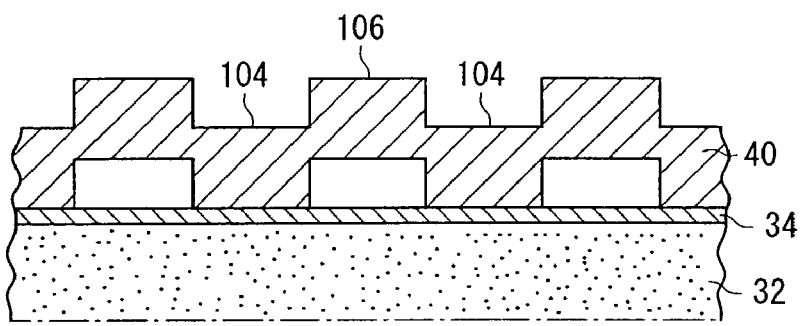

Subsequently, as shown in FIG. 13C (see FIG. 5A), the metal plate 18, the fourth brazing member 100, the heat spreader member 22, the first brazing member 26, the buffer plate 28, the second brazing member 30, the insulating substrate 32, the third brazing member 34, and the circuit-forming metal plate 40 plated with the Ni plating layer 38 on the upper surface are placed (subjected to setting) in this order on the jig 72, and the components are fixed on the jig 72. In this procedure, the lower surfaces of the portions 104 to be converted into the circuit thereafter, of the circuit-forming metal plate 40 are adhered onto the third brazing member 34. FIG. 13C shows a state in which the circuit-forming metal plate 40 is placed and fixed on the insulating substrate 32 with the third brazing member 34 interposed therebetween.

Figure 13D:
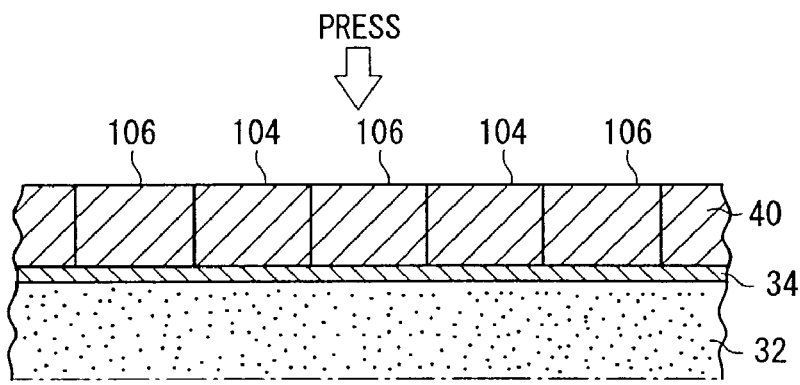

After that, as shown in FIG. 13D (see FIG. 5B), the circuit-forming metal plate 40 is pressed vertically, for example, with a punch (not shown) having a flat lower surface. During this process, the bridges 106 are moved downwardly by being pressed by the punch. Accordingly, the bridges 106 are sheared. The sheared bridges 106 are depressed by being pressed by the punch to the positions at which they are sheared. However, even when the sheared bridges 106 are depressed until they are completely contacted with the brazing member 34 as shown in FIG. 13D, they are not adhered.

Figure 13E:
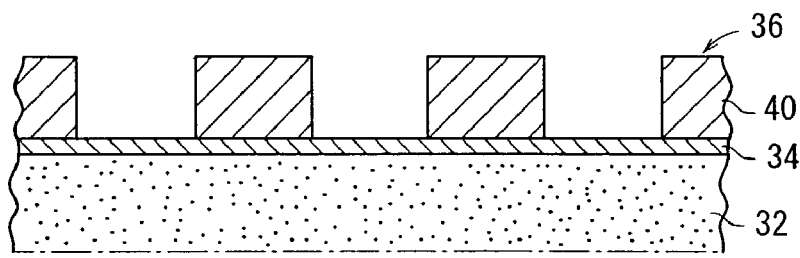

After that, as shown in FIG. 13E, the bridges 106, which have been placed on the third brazing member 34, are discharged to the outside. The discharge may be effected by performing, for example, a method in which a tape or the like applied with an adhesive is pressed against the bridges to pull out the bridges, and a method in which the bridges are mechanically pinched to pull out the bridges. Accordingly, the circuit 36 of the circuit-forming metal plate is formed on the insulating substrate 32.

Figure 5B:
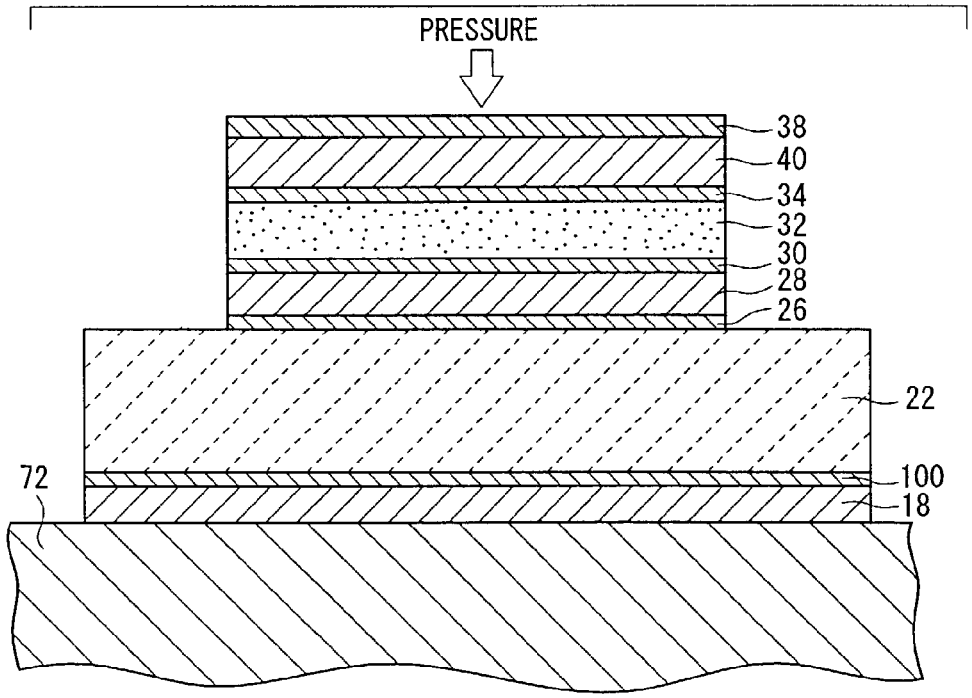
FIG. 5B illustrates a joining step.

After that, as shown in FIG. 5B, the metal plate 18, the fourth brazing member 100, the heat spreader member 22, the first brazing member 26, the buffer plate 28, the second brazing member 30, the insulating substrate 32, the third brazing member 34, and the circuit-forming metal plate 40, which are fixed on the jig 72, are pressurized vertically, for example, in vacuum of not more than $1.0 \times 10^{-5}$ Torr, while the components are joined to one another by raising/lowering the temperature.

After that, in the same manner as in the first production method described above, the sandblast treatment is performed for the entire surface including the circuit 36 or using the mask 82. Thus, the conductive reactive layer 70, which is exposed from the metal-removed portion 36a of the circuit 36, is removed.

Figure 14A:
FIGS. 14A to 14D show steps illustrating an example of a method based on etching in the second production method.
Figure 14B:
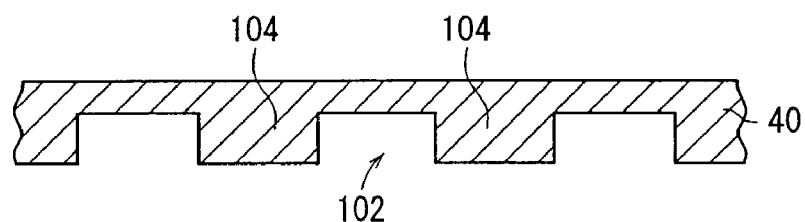

Next, in the production method according to the second modified embodiment, a circuit-forming metal plate 40 is prepared as shown in FIG. 14A. After that, as shown in FIG. 14B, portions other than portions 104 to be converted into the circuit thereafter of the circuit-forming metal plate 40 are subjected to etching so that the thickness of the portions is thinned. At this stage, a circuit pattern 102 based on the etching treatment is formed on the circuit-forming metal plate 40.

Figure 14C:
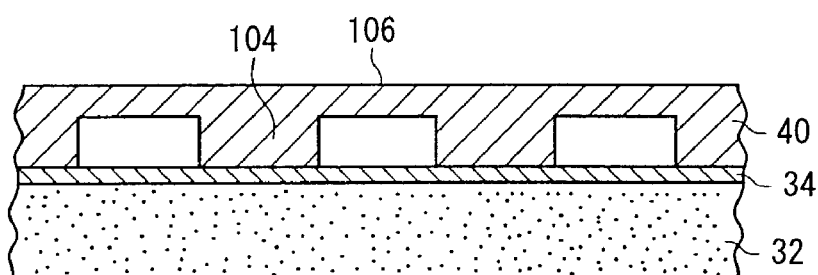

After that, as shown in FIG. 14C (see FIG. 5A), the metal plate 18, the fourth brazing member 100, the heat spreader member 22, the first brazing member 26, the buffer plate 28, the second brazing member 30, the insulating substrate 32, the third brazing member 34, and the circuit-forming metal plate 40 are placed (subjected to setting) in this order on the jig 72, and the components are fixed on the jig 72. In this process, the circuit-forming metal plate 40 is placed and fixed while the surface, which is irregular or convex/concave as a result of the etching, is opposed to the third brazing member 34. Accordingly, the portions having the thin thickness of the circuit-forming metal plate 40 function as bridges 106 to connect portions of the circuit.

After that, the metal plate 18, the fourth brazing member 100, the heat spreader member 22, the first brazing member 26, the buffer plate 28, the second brazing member 30, the insulating substrate 32, the third brazing member 34, and the circuit-forming metal plate 40, which are fixed on the jig 72 (see FIG. 5), are pressurized vertically, for example, in vacuum of not more than $1.0 \times 10^{-5}$ Torr, while the components are joined to one another by raising/lowering the temperature.

Figure 14D:
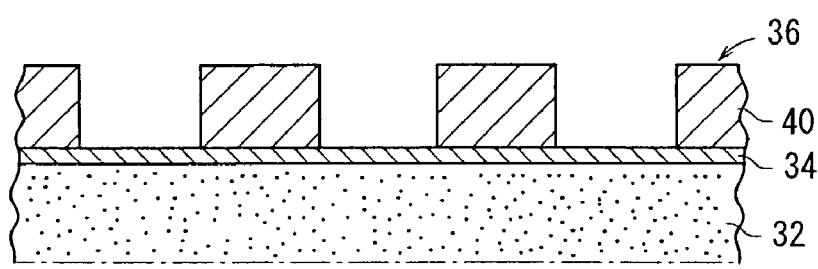
Figure 16:
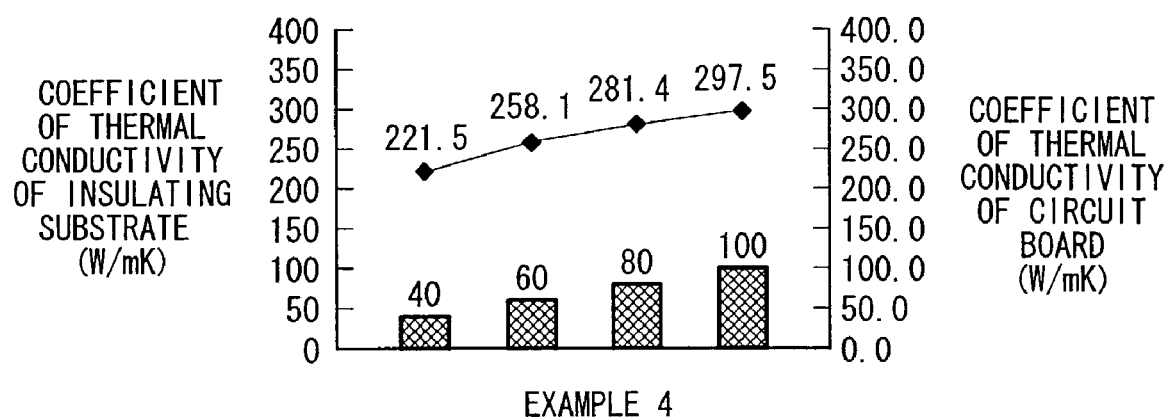
FIG. 16 shows characteristics illustrating results of Example 2 in a second illustrative experiment (illustrative experiment to observe the change of the coefficient of thermal conductivity of the circuit board depending on the coefficient of thermal conductivity of the insulating substrate)

After that, the bridges 106 are cut and removed, for example, with nippers as shown in FIG. 14D. Thus, the circuit 36 of the circuit-forming metal plate 40 is formed on the insulating substrate 32. In this procedure, it is sufficient that the bridges 106 are provided at necessary sites at which the respective portions of the circuit-forming metal plate 40 to be converted into the circuit thereafter do not cause any positional discrepancy. All of the sites other than the respective portions to be converted into the circuit thereafter do not necessarily have the shape of bridge, in the same manner as in the preceding embodiment.

After that, in the same manner as in the production method described above, the sandblast treatment is performed for the entire surface including the circuit 36 or using the mask 82. Thus, the conductive reactive layer 70, which is exposed from the metal-removed portion 36a of the circuit 36, is removed.

Preferred specified embodiments of the circuit board 10A according to the first embodiment will now be explained below.

At first, as shown in FIG. 1, it is preferable that the buffer plate 28 is provided between the insulating substrate 32 and the heat spreader member 22. Owing to the buffer plate 28, it is possible to improve the heat cycle characteristics of the circuit board 10A.

A first illustrative experiment will now be described. In the first illustrative experiment, the heat cycle test was performed for Comparative Example 1 and Examples 1 to 3. In the Comparative Example 1, the buffer plate 28 is omitted from the circuit board 10A according to the first embodiment. The Examples 1 to 3 are constructed in approximately the same manner as the circuit board 10A according to the first embodiment. Specified joining structures are shown in FIG. 15.

The thermal shock condition for one cycle in the heat cycle test is such that a temperature of 65° C. is applied for 15 minutes, and then a temperature of 150° C. is applied for 15 minutes (in accordance with the test condition of MIL-STD-833C 1010.6C in MIL Standards of USA). In the first illustrative experiment, the heat cycle tests of 500 cycles and 3000 cycles were performed for the Comparative Example 1 and the Examples 1 to 3 to observe states of exfoliation of the respective joining structures.

Experimental results are shown in FIG. 15. It was revealed that any exfoliation already occurred between the insulating substrate 32 and the heat spreader member 22 at a stage of 500 cycles in the Comparative Example 1, but no exfoliation occurred even after 3000 cycles in the Examples 1 to 3.

It is preferable that the thickness of the buffer plate 28 is not less than 0.03 mm, for the following reason. If the thickness is less than 0.03 mm, no function as the buffer plate 28 as described above may not be exhibited.

Further, as for the insulating substrate 32, it is preferable that the thickness of the insulating substrate 32 is not more than 0.3 mm when the insulating substrate 32 is composed of $Si_3N_4$. Accordingly, even when the coefficient of thermal conductivity of the insulating substrate 32 itself is 40 W/mK which is low, the coefficient of thermal conductivity of the circuit board 10A can be made to be not less than 200 W/mK when the circuit board 10A is prepared.

Second and third illustrative experiments will now be described. In the second illustrative experiment, observation was made for the change of the coefficient of thermal conductivity of the circuit board 10A depending on the coefficient of thermal conductivity (40 W/mK, 60 W/mK, 80 W/mK, 100 W/mK) of the insulating substrate 32 ($Si_3N_4$) for Comparative Example 2 to 4 and Example 4. The thickness of the insulating substrate 32 was 0.3 mm in the Example 2, the thickness of the insulating substrate 32 was 0.6 mm in the Comparative Example 2, the thickness of the insulating substrate 32 was 0.9 mm in the Comparative Example 3, and the thickness of the insulating substrate 32 was 1.2 mm in the Comparative Example 4. Experimental results are shown in FIGS. 16 to 19.

Figure 17:
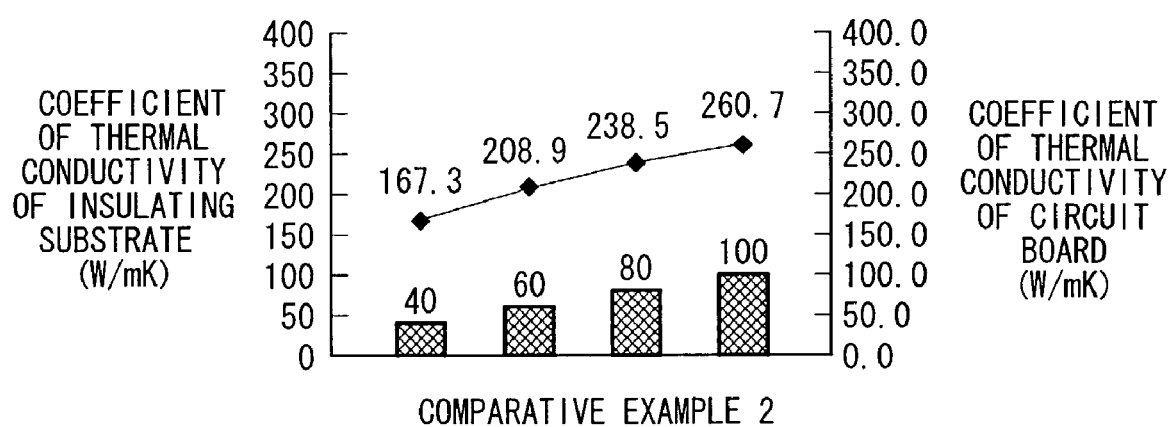
FIG. 17 shows characteristics illustrating results of Comparative Example 2 in the second illustrative experiment.
Figure 18:
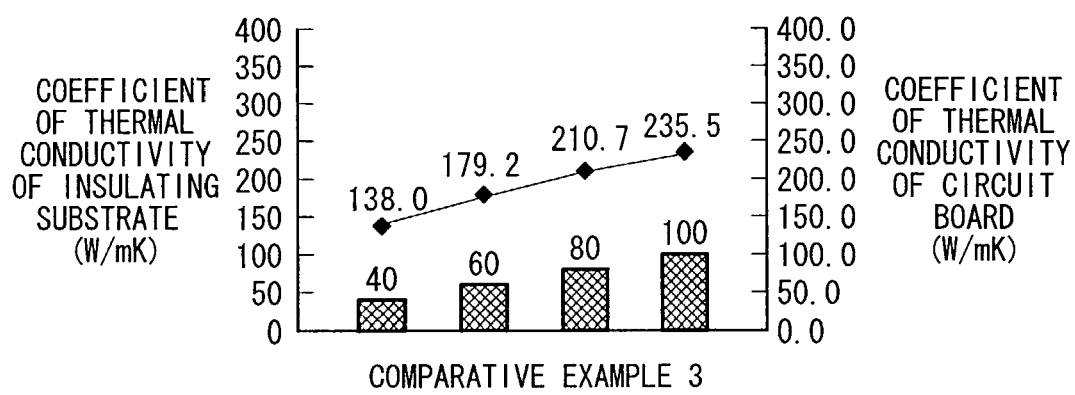
FIG. 18 shows characteristics illustrating results of Comparative Example 3 in the second illustrative experiment.
Figure 19:
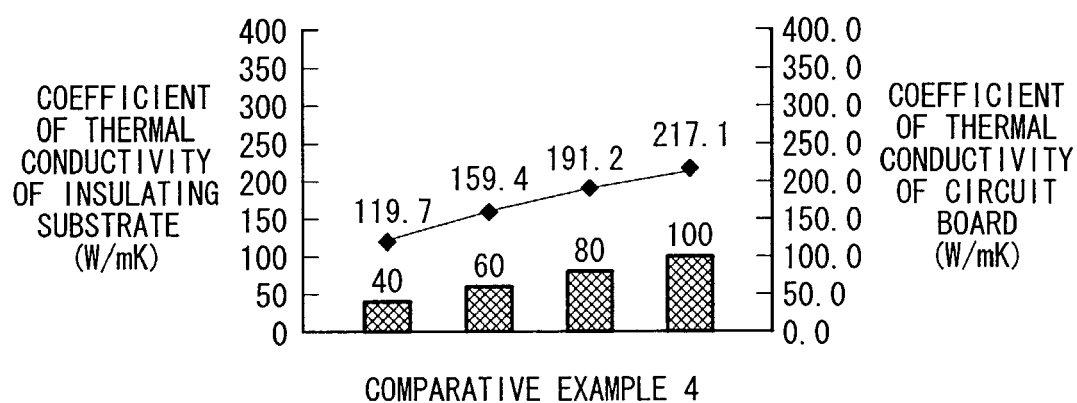
FIG. 19 shows characteristics illustrating results of Comparative Example 4 in the second illustrative experiment.

As for FIGS. 16 to 19, FIG. 16 shows the result of the Example 4, FIG. 17 shows the result of the Comparative Example 2, FIG. 18 shows the result of the Comparative Example 3, and FIG. 19 shows the result of the Comparative Example 4.

According to the results, it is appreciated that the coefficient of heat transfer, which is obtained when the circuit board 10A is prepared, is high, i.e., 221.5 W/mK in the Example 2 even when the coefficient of heat transfer of the insulating substrate 40 itself is low, i.e., 40 W/mK.

On the other hand, in third illustrative experiment, observation was made for the heat cycle, the coefficient of thermal conductivity of the circuit board 10A, and the insulation performance of the insulating substrate 32 for Comparative Example 5 and Examples 5 to 8. Any one of the insulating substrates 32 used had a coefficient of thermal conductivity of 100 W/mK.

In the Comparative Example 5, a structure was provided, in which the thickness of the insulating substrate 32 was 0.635 mm in the circuit board 10A according to the first embodiment. In the Examples 5 to 8, the thickness of the insulating substrate 32 was 0.3 mm, 0.15 mm, 0.10 mm, and 0.07 mm respectively in the circuit board 10A according to the first embodiment. Specified joining structures and experimental results are shown in FIG. 20.

No exfoliation was observed in the heat cycle test for 3000 cycles in all of the Comparative Example 5 and the Examples 5 to 8. Further, the insulation performance was satisfactory. As for the coefficient of thermal conductivity, it is appreciated that the Examples 5 to 8 exhibited greatly high values, i.e., 290 W/mK, 308 W/mK, 325 W/mK, 340 W/mK, as compared with 250 W/mK in the Comparative Example 5.

Figure 21:
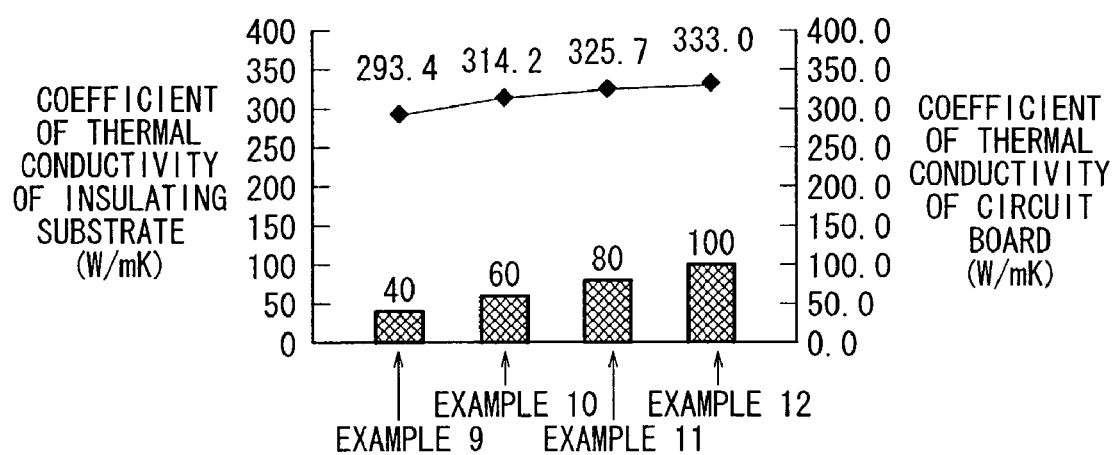
FIG. 21 shows characteristics illustrating results of a fourth illustrative experiment (illustrative experiment to observe the change of the coefficient of thermal conductivity of the circuit board depending on the coefficient of thermal conductivity of the insulating substrate itself)

Especially, it is appreciated that the coefficient of heat transfer of the circuit board 10A is scarcely changed when the thickness of the insulating substrate ($Si_3N_4$) is 0.1 mm, according to experimental results shown in FIG. 21 (fourth illustrative experiment). In the fourth illustrative experiment, the change of the coefficient of heat transfer of the circuit board 10A was observed when the thickness of the circuit 36 was 0.3 mm, the thickness of the buffer plate 28 was 0.25 mm, the thickness of the heat spreader member 22 was 3.0 mm and the coefficient of thermal conductivity of the insulating substrate 32 itself was 40 W/mK (Example 9), 60 W/mK (Example 10), 80 W/mK (Example 11), and 100 W/mK (Example 12).

Further, it is preferable for the circuit board 10A according to the first embodiment that the ratio between the thickness of the circuit 36 and the total thickness of the buffer plate 28, the heat spreader member 22, and the metal plate 18 is 1:0.5 to 1:3. Accordingly, the lower surface of the metal plate 18 is warped so that the lower surface has a convex shape toward the outside. For example, when the heat sink member 20 is joined or fixed to the lower surface of the metal plate 18, it is possible to enhance the tight contact performance.

Explanation will now be made for illustrative experiments (fifth to eighth illustrative experiments) in relation to the warpage of the circuit board 10A depending on the thicknesses of the circuit 36, the buffer plate 28, and the metal plate 18.

At first, in the fifth illustrative experiment, observation was made for the change of the amount of warpage of the circuit board 10A depending on the thickness of the circuit 36. The amount of warpage of the circuit board 10A was measured when the thickness of the insulating substrate 32 ($Si_3N_4$) was 0.3 mm, the thickness of the buffer plate 28 was 0.3 mm, the thickness of the heat spreader member 22 was 3.0 mm, the thickness of the metal plate 18 was 0.3 mm, and the thickness of the circuit 36 was 0.3 mm (Comparative Example 6), 1.0 mm (Comparative Example 7), 3.0 mm (Example 13), and 10.0 mm (Example 14). A laser confocal displacement meter (Model LT-8110) produced by Keyence was used as a measuring apparatus.

Figure 23:
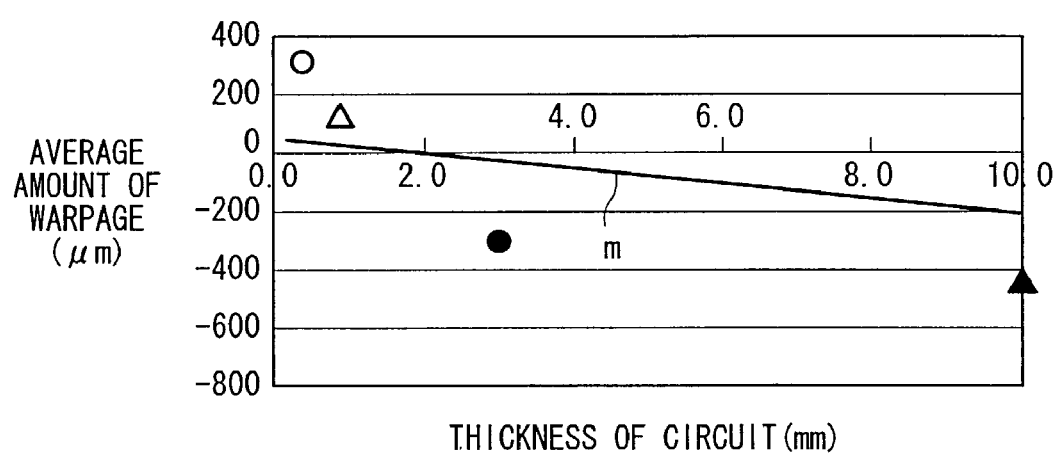
FIG. 23 shows characteristics illustrating results of the fifth illustrative experiment.

Experimental results are shown in FIGS. 22 and 23. In FIG. 23, the plot of the Comparative Example 6 is indicated by an open circle, the plot of the Comparative Example 7 is indicated by an open triangle, the plot of the Example 13 is indicated by a solid circle, and the plot of the Example 14 is indicated by a solid triangle.

According to the results, the warpage is formed in both of the Comparative Examples 6 and 7 such that the front surface of the circuit 36 is convex (lower surface of the metal plate 18 is concave). In contrast, the warpage is formed in both of Examples 13 and 14 such that the front surface of the circuit 36 is concave (lower surface of the metal plate 18 is convex). Further, as indicated by a virtual line m (straight line depicted by approximation in accordance with the least square method for the plots of the Comparative Examples 6, 7 and the Examples 13, 14) shown in FIG. 23, it is understood that the amount of warpage can be controlled by changing the thickness of the circuit 36. It is also possible to make the amount of warpage to be zero by controlling the thickness of the circuit 36.

Next, in the sixth illustrative experiment, observation was made for the change of the amount of warpage of the circuit board 10A depending on the thickness of the buffer plate 28. In the sixth illustrative experiment, the thickness of the circuit 36 was 0.3 mm, the thickness of the insulating substrate 32 was 0.3 mm, the thickness of the heat spreader member 22 was 3.0 mm, the thickness of the metal plate 18 was 0 mm (formation of the metal plate 18 was omitted), and the joining pressure was 2.5 kgf/cm². The amount of warpage of the circuit board 10A was measured while changing the type of the insulating substrate 32 and the thickness of the buffer plate 28 for Examples 15 to 26. Experimental results are shown in FIGS. 24 and 25.

According to the results, in Examples 15 and 16 in which AlN is used for the insulating substrate 32, the warpage is formed such that the front surface of the circuit 36 is concave (lower surface of the heat spreader member 22 is convex). On the other hand, in Examples 17 to 26 in which $Si_3N_4$ is used for the insulating substrate 32, the warpage is formed such that the front surface of the circuit 36 is convex (lower surface of the heat spreader member 22 is concave).

Figure 25:
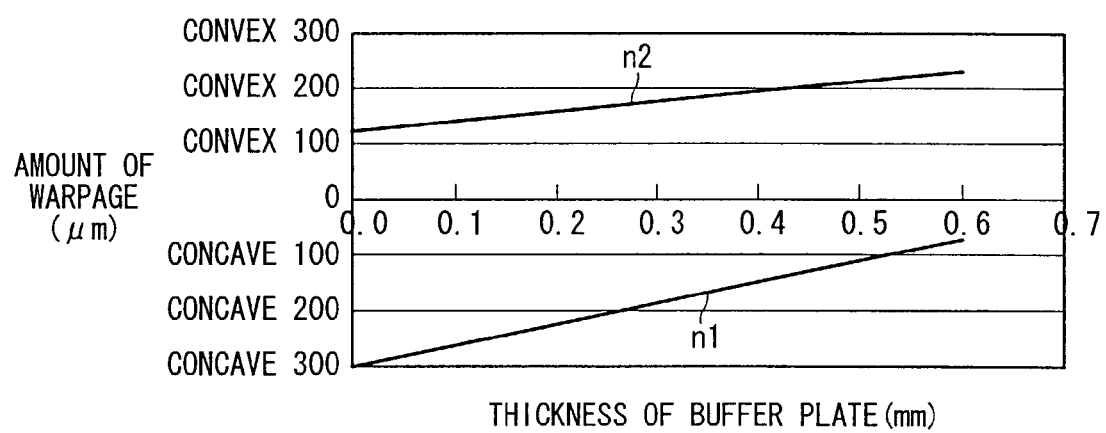
FIG. 25 shows characteristics illustrating results of the sixth illustrative experiment.
Figure 26:
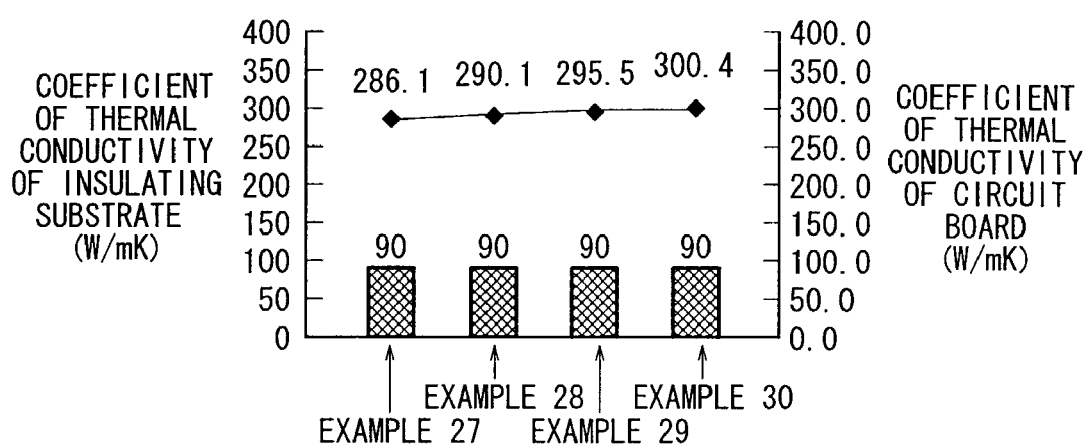
FIG. 26 shows characteristics illustrating results of a seventh illustrative experiment (illustrative experiment to observe the change of the coefficient of thermal conductivity of the circuit board when the thickness of the buffer plate is changed)

Especially, FIG. 25 shows a straight line n1 depicted by approximation in accordance with the least square method for the plots of the Examples 15 and 16 by using AlN for the insulating substrate 32, and a straight line n2 depicted by approximation in accordance with the least square method for the plots of the Examples 17 to 26.

According to the results of the Examples 15 and 16, as the thickness of the buffer plate 28 is increased, the amount of warpage of the concave front surface of the circuit 36 is gradually decreased. On the other hand, according to the results of the Examples 17 to 26, as the thickness of the buffer plate 28 is increased, the amount of warpage of the convex front surface of the circuit 36 is gradually increased.

According to this fact, it is appreciated that the amount of warpage of the circuit board 10A can be controlled by changing the thickness of the buffer plate 28. However, if the thickness of the buffer plate 28 exceeds a thickness of 0.5 mm, when AlN is used for the insulating substrate 32, then the amount of warpage of the concave front surface of the circuit 36 of the circuit board 10A almost disappears. It may be difficult to allow the cooling fin to make tight contact with the lower surface of the metal plate 18. In view of the above, it is preferable that the thickness of the buffer plate 28 is 0.03 to 0.5 mm.

The change of the coefficient of heat transfer of the circuit board 10A was investigated when the thickness of the buffer plate 28 was changed. According to experimental results shown in FIG. 26 (seventh illustrative experiment), the coefficient of heat transfer of the circuit board 10A is scarcely changed. In the seventh illustrative experiment, the change of the coefficient of heat transfer of the circuit board 10A was observed when the coefficient of thermal conductivity of the insulating substrate 32 ($Si_3N_4$) itself was 90 W/mK, and the thickness of the buffer plate 28 was 0.1 mm (Example 27), 0.3 mm (Example 28), 0.6 mm (Example 29), and 0.9 mm (Example 30). The thickness of the circuit 36 was 0.3 mm, the thickness of the insulating substrate 32 was 0.3 mm, and the thickness of the heat spreader member 22 was 3.0 mm.

Next, in the eighth illustrative experiment, observation was made for the change of the amount of warpage of the circuit board 10A depending on the thickness of the metal plate 18. In the eighth illustrative experiment, the thickness of the circuit 36 was 0.3 mm, the thickness of the buffer plate 28 was 0.3 mm, and the thickness of the heat spreader member 22 was 3.0 mm. The amount of warpage of the circuit board 10A was measured by changing the thickness of the metal plate 18 for Examples 31 to 33. In Example 31, the thickness of the insulating substrate 32 ($Si_3N_4$) was 0.3 mm. In Example 32, the thickness of the insulating substrate 32 (AlN) was 0.3 mm. In Example 33, the thickness of the insulating substrate 32 (AlN) was 0.5 mm.

Figure 27:
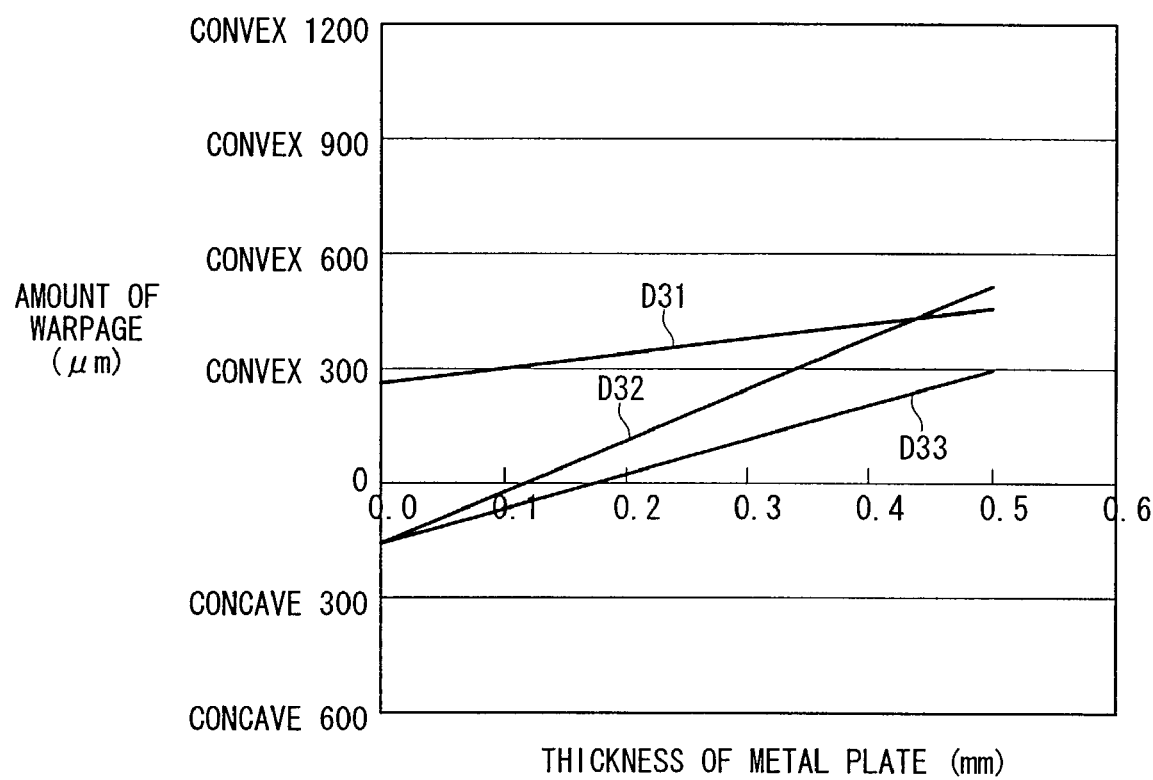
FIG. 27 shows characteristics illustrating results of an eighth illustrative experiment (illustrative experiment to observe the change of the amount of warpage of the circuit board depending on the thickness of the metal plate)

Experimental results are shown in FIG. 27. In FIG. 27, Example 31 is depicted by solid line D31, Example 32 is depicted by solid line D32, and Example 33 is depicted by solid line D33.

In Example 31, the warpage is formed such that the front surface of the circuit 36 is convex (lower surface of the metal plate 18 is concave) over a range of the thickness of the metal plate 18 of 0 mm to 0.5 mm. As the thickness of the metal plate 18 is increased, the amount of warpage of the convex front surface of the circuit 36 is also gradually increased.

In Example 32, the warpage is formed such that the front surface of the circuit 36 is concave (lower surface of the metal plate 18 is convex) over a range of the thickness of the metal plate 18 of 0 mm to 0.12 mm. As the thickness of the metal plate 18 is increased, the amount of warpage of the concave front surface of the circuit 36 is gradually decreased. Further, in Example 32, the warpage is formed such that the front surface of the circuit 36 is convex (lower surface of the metal plate 18 is concave) over a range of the thickness of the metal plate 18 of 0.12 mm to 0.5 mm. As the thickness of the metal plate 18 is increased, the amount of warpage of the convex front surface of the circuit 36 is also gradually increased.

In Example 33, the warpage is formed such that the front surface of the circuit 36 is concave (lower surface of the metal plate 18 is convex) over a range of the thickness of the metal plate 18 of 0 mm to 0.19 mm. As the thickness of the metal plate 18 is increased, the amount of warpage of the concave front surface of the circuit 36 is gradually decreased. Further, in Example 33, the warpage is formed such that the front surface of the circuit 36 is convex (lower surface of the metal plate 18 is concave) over a range of the thickness of the metal plate 18 of 0.19 mm to 0.5 mm. As the thickness of the metal plate 18 is increased, the amount of warpage of the convex front surface of the circuit 36 is also gradually increased.

The amount of warpage of the circuit board 10A can be controlled by changing the thickness of the metal plate 18.

In the circuit board 10A according to the first embodiment, it is preferable that a hard brazing member having a composition of Ag—Cu—In—Ti is used for the first to fourth brazing members 26, 30, 34, 100. It is preferable that the amount of the active element (Ti) contained in each of the second and third brazing members 30, 34 is 0.05 to 2%. It is preferable that the amount of the active element (Ti) contained in each of the first and fourth brazing members 26, 100 is 0.5 to 10%.

It is preferable that the thickness of each of the second and third brazing members 30, 34 is not more than 10% of the thickness of the buffer plate 28. Specifically, it is preferable that the thickness of each of the second and third brazing members 30, 34 is not more than 10 μm. On the other hand, it is preferable that the thickness of each of the first and fourth brazing members 26, 100 is not more than 25% of the thickness of the buffer plate 28.

Next, explanation will be made for illustrative experiments (ninth to eleventh illustrative experiments) in relation to the first to fourth brazing members 26, 30, 34, 100.

At first, in the ninth illustrative experiment, observation was made for the difference in heat cycle and coefficient of thermal conductivity depending on the joining temperature for Examples 34 to 36. In all of Examples 34 to 36, a brazing member having the following composition and properties was used for the first to fourth brazing members 26, 30, 34, 100, in which the thickness was 50 μm:
Composition: Ag(59)-Cu(27.25)-In(12.5)-Ti(1.25);
Melting point (liquid phase): 715° C.;
Melting point (solid phase): 605° C.;
Thermal conductivity: 70 W/mK;
Specific gravity: 9.7 g/cm³.

In Examples 34 and 35, the joining temperature and the joining time were 680° C. (temperature between the solid phase and the liquid phase) and 10 minutes respectively. In Example 36, the joining temperature and the joining time were 780° C. (temperature not less than the liquid phase) and 10 minutes respectively.

Experimental results are shown in FIG. 28. As appreciated from the experimental results, even when the joining temperature is the temperature between the solid phase and the liquid phase, the results of the heat cycle test and the coefficient of thermal conductivity are scarcely changed as compared with the case in which the joining temperature is the temperature of not less than the liquid phase. In other words, even when the first to fourth brazing members 26, 30, 34, 100 are not converted into the liquid form, then the circuit 36, the insulating substrate 32, the buffer plate 28, the heat spreader member 22, and the metal plate 18 can be tightly joined, and the coefficient of thermal conductivity of the circuit board 10A is satisfactory.

Figure 29:
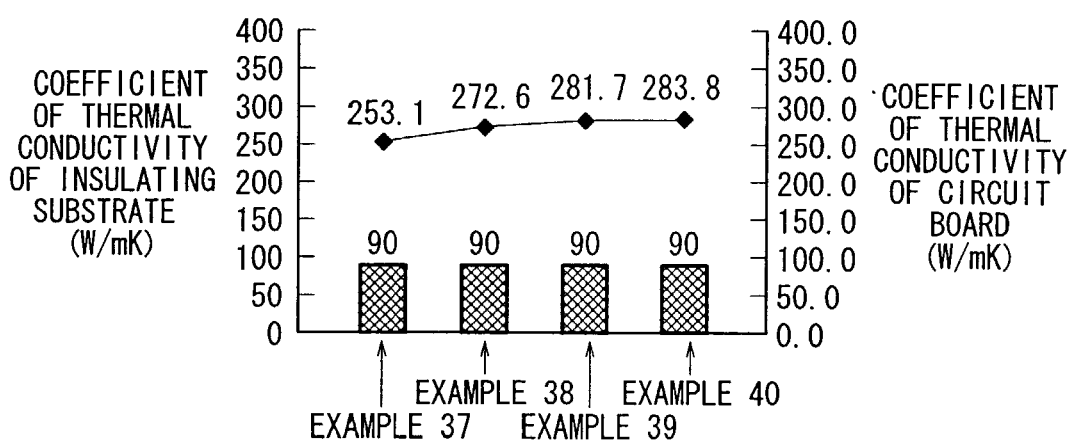
FIG. 29 shows characteristics illustrating results of a tenth illustrative experiment (illustrative experiment to observe the difference in coefficient of thermal conductivity of the circuit board depending on the residual thickness of each of first and second brazing members for Examples 37 to 40)

When the joining temperature is the temperature between the solid phase and the liquid phase of the brazing member, the brazing member remains in the circuit board 10A. However, according to the following tenth illustrative experiment, the coefficient of thermal conductivity scarcely differs even when the thickness of the brazing member remaining in the circuit board 10A is changed. In the tenth illustrative experiment, observation was made for the difference in coefficient of thermal conductivity of the circuit board 10A depending on the residual thickness of each of the first and second brazing members 26, 30 for Examples 37 to 40. In Example 37, the residual thickness of each of the first and second brazing members 26, 30 was 150 µm. In Example 38, the residual thickness was 50 µm. In Example 39, the residual thickness was 10 µm. In Example 40, the residual thickness was 1 µm. The coefficient of thermal conductivity of the insulating substrate 32 ($Si_3N_4$) was 90 W/mK. Experimental results are shown in FIG. 29.

According to the experimental results, the coefficient of thermal conductivity of the circuit board 10A is scarcely changed even when the residual thickness of each of the first and second brazing members 26, 30 is changed within a range of 1 µm to 150 µm.

Next, in the eleventh illustrative experiment, observation was made for the difference in pollution state, peel strength, heat cycle, and coefficient of thermal conductivity of the circuit 36 depending on the thickness of each of the first to fourth brazing members 26, 30, 34, 100 for Comparative Examples 8 to 10 and Examples 41 to 43. Experimental results are shown in FIG. 30. In FIG. 30, the "thickness of brazing member (1)" refers to the thickness of each of the second and third brazing members 30, 34, and the "thickness of brazing member (2)" refers to the thickness of each of the first and fourth brazing members 26, 100.

The composition of each of the first to fourth brazing members 26, 30, 34, 100 used in the experiment was Ag(59)-Cu(27.25)-In(12.5)-Ti(1.25). The joining temperature was 780° C., and the joining time was 10 minutes.

The thickness of the circuit 36 was 0.3 mm, the thickness of the insulating substrate 32 ($Si_3N_4$) was 0.3 mm, the thickness of the buffer plate 28 was 0.3 mm, the thickness of the heat spreader member 22 was 2.7 mm, and the thickness of the metal plate 18 was 0.3 mm.

According to the experimental results, when the thickness of each of the second and third brazing members 30, 34 is not less than 30 µm, unnecessary portions of the second and third brazing members 30, 34 outflow to the outside to pollute the circuit 36 when the circuit 36, the insulating substrate 32, the buffer plate 28, the heat spreader member 22, and the metal plate 18 are joined as shown in Comparative Examples 8 and 9 and Example 41. Especially, when the thickness of each of the second and third brazing members 30, 34 is 50 µm as in Comparative Examples 8 and 9, unnecessary portions of the brazing members 30, 34 stick out in a large amount when the components are joined, resulting in an extreme pollution state of the circuit 36.

On the other hand, as shown in Examples 42, 43 and Comparative Example 10, the circuit 36 is scarcely polluted when the thickness of each of the second and third brazing members 30, 34 is 10 µm.

Further, as in Comparative Example 8 and Example 43, when the thickness of each of the first and fourth brazing members 26, 100 was 50 µm, the peel strength of the circuit board 10A was 85 kgf/cm² and 90 kgf/cm². As in Examples 41 and 42, when the thickness of each of the first and fourth brazing members 26, 100 was 30 µm, the peel strength of the circuit board 10A was 52 kgf/cm² and 55 kgf/cm². Further, as in Comparative Examples 9 and 10, when the thickness of each of the first and fourth brazing members 26, 100 was 10 µm, the peel strength of the circuit board 10A was 32 kgf/cm² and 30 kgf/cm².

The peel strength of the circuit board 10A is low when the thickness of each of the first and fourth brazing members 26, 100 is thin. No exfoliation was observed for any one of Comparative Examples 8 to 10 and Examples 41 to 43 in the heat cycle test of 500 cycles. As for the coefficient of thermal conductivity, no significant change was observed for Comparative Examples 8 to 10 and Examples 41 to 43.

As shown in Examples 41 to 43, it is preferable that the thickness of each of the second and third brazing members 30, 34 is not more than 30 µm, and the thickness of each of the first and fourth brazing members 26, 100 is not less than 30 µm.

Next, in the twelfth illustrative experiment, observation was made for the difference in peel strength, heat cycle, and coefficient of thermal conductivity depending on the amount of the active element (Ti) in the first and fourth brazing members 26, 100 for Comparative Example 11 and Examples 44 to 46. Experimental results are shown in FIG. 30.

As for the second and third brazing members 30, 34 used in the experiment, the composition was Ag(59)-Cu(27.25)-In(12.5)-Ti(1.25), and the thickness was 10 µm. As for the first and fourth brazing members 26, 100, the composition was Ag(59)-Cu(27.25)-In(12.5)-Ti(1.25+a), for which a Ti foil was used in combination with a foil of the brazing member having the same composition as that of the second and third brazing members 30, 34. Therefore, the thickness was 10 µm (thickness of foil of brazing member)+thickness of Ti foil. The joining temperature was 780° C., and the joining time was 10 minutes.

In Comparative Example 11 and Examples 44 to 46, the ratio between the thickness of the brazing member foil and the thickness of the Ti foil was changed for the first and fourth brazing members 26, 100. Specifically, as shown in FIG. 31, in Comparative Example 11, there was given (thickness of brazing member foil): (thickness of Ti foil)=10 (µm): 0 (µm). In Example 44, there was given (thickness of brazing member foil): (thickness of Ti foil)=10 (µm): 0.7 (µm). In Example 45, there was given (thickness of brazing member foil): (thickness of Ti foil)=10 (µm): 1 (µm). In Example 46, there was given (thickness of brazing member foil): (thickness of Ti foil)=10 (µm): 2 (µm).

Experimental results are shown in FIG. 31. According to FIG. 31, when the Ti foil is not combined with the first and fourth brazing members 26, 100, i.e., when the amount of Ti is not increased, the peel strength of the circuit board 10A is 32 kgf/cm² which is low. On the other hand, when the thickness of the Ti foil is increased to 0.7 µm, 1 µm, and 2 µm as in Examples 44 to 46, the peel strength of the circuit board 10A is also increased to 65 kgf/cm², 90 kgf/cm², and 115 kgf/cm².

No exfoliation was observed for any one of Comparative Example 11 and Examples 44 to 46 in the heat cycle test of 500 cycles. As for the coefficient of thermal conductivity, no significant change was observed for Comparative Example 11 and Examples 44 to 46.

In the method for producing the circuit board 10A according to the first embodiment, it is preferable that the sandblast treatment, which is performed in order to remove the conductive reactive layer 70 exposed from the metal-removed portion of the circuit 36, is carried out by using the mask 82.

Accordingly, the surface of the circuit 36 (surface of the circuit 36 or the plating layer 38) is not scraped by the grains for the sandblast treatment. Therefore, as for the specular reflection, it is possible to maintain the specular reflection obtained at the stage at which the circuit 36 is formed or at the stage at which the plating layer 38 is formed.

Therefore, for example, in the wire bonding treatment for the circuit 36 (or the plating layer 38) to be performed thereafter, there is no decrease in degree of tight contact of the bonding wire with respect to the circuit 36 (or the plating layer 38).

Explanation will now be made for the thirteenth illustrative experiment to observe the relationship between the surface state (specular reflection) of the circuit 36 and the wire bonding performance (tight contact performance for bonding wire).

In the thirteenth illustrative experiment, observation was made for the difference in tight contact performance for bonding wire with respect to the circuit 36 (or the plating layer 38) depending on the specular reflection of the circuit 36 (or the plating layer 38) for Comparative Example 12 and Examples 47 to 53. Results are shown in FIG. 32. In FIG. 32, the bonder output indicates the output obtained when the tight contact performance for bonding wire is satisfactory (acceptance rate: 100%).

In Comparative Example 12, when the conductive reactive layer 70 exposed from the metal-removed portion of the circuit 36 was removed by means of the sandblast treatment, the sandblast treatment was directly applied to the surface of the circuit 36 (or the plating layer 38). In Examples 47 to 53, the sandblast treatment was performed using the mask 82, in which the specular reflection of the surface was changed respectively.

According to FIG. 32, the higher the specular reflection of the circuit 36 (or the plating layer 38) is, the more satisfactory the tight contact performance for bonding wire is, even when the bonder output is low. The lower the specular reflection of the circuit 36 (or the plating layer 38) is, the more unsatisfactory the tight contact performance for bonding wire is. Practically, it is preferable that the surface roughness of the circuit 36 (or the plating layer 38) is not more than Ra=1.

As described above, in the circuit board 10A according to the first embodiment, the circuit 36 is manufactured by applying the etching treatment and the sandblast treatment to the metal plate 40 joined using the third brazing member 34 having the active element onto the insulating substrate 32. Alternatively, the circuit-forming metal plate 40, on which the circuit pattern 102 is previously formed, is joined onto the insulating substrate 32 using the third brazing member 34, and then the sandblast treatment is applied. Therefore, the etching residue such as the conductive reactive layer 70 or the like, which remains on the insulating substrate 32, can be removed with ease. It is possible to obtain the circuit board 10A which is excellent in both of appearance and characteristics.

Especially, the Ni plating layer 38 is allowed to remain on the circuit 36. Therefore, the wettability of the solder layer 14 formed on the circuit 36 is satisfactory. It is possible to reliably mount the semiconductor device 16 on the circuit 36.

Figure 33:
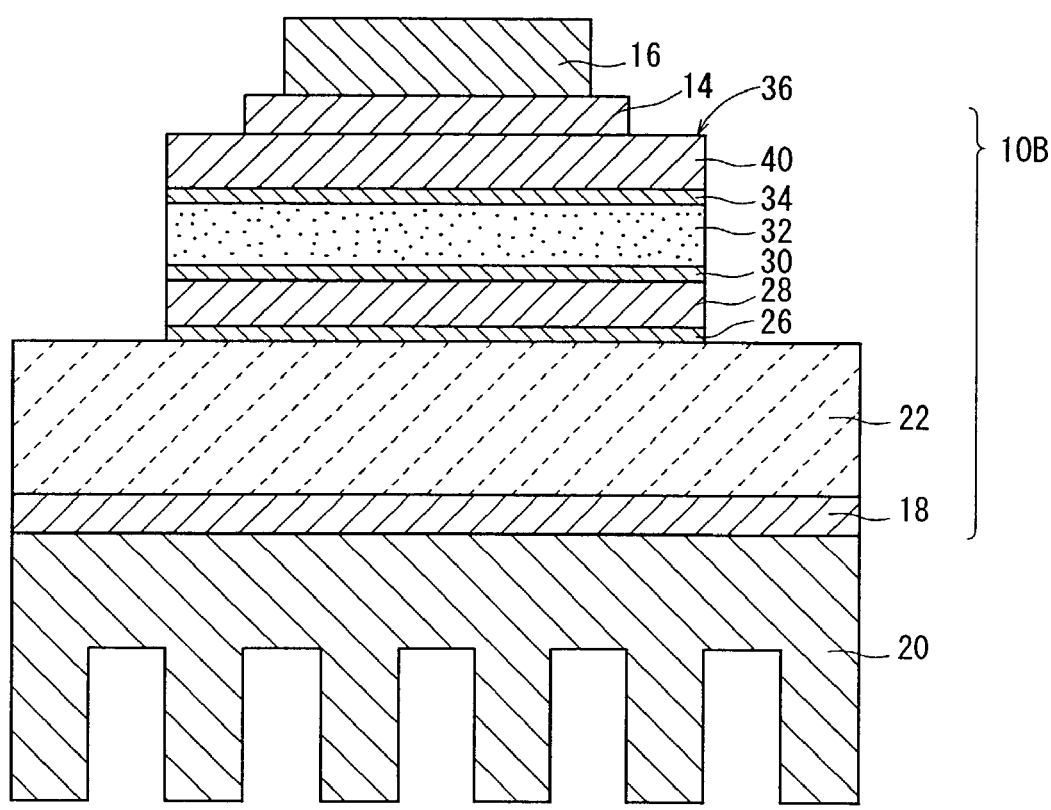
FIG. 33 is a vertical sectional view illustrating a circuit board according to a second embodiment and an electronic part based on the use of the circuit board.

Next, explanation will be made with reference to FIG. 33 for a circuit board 10B according to a second embodiment and an electronic part 12B using the circuit board 10B.

The electronic part 12B comprises a semiconductor device 16 which is mounted on the circuit board 10B according to the second embodiment with a solder layer 14 interposed therebetween, and a cooling fin 20 which is fixed to the lower surface of the circuit board 10B with a metal layer 18 interposed therebetween, in the same manner as the electronic part 10A described above.

The circuit board 10B according to the second embodiment is constructed in approximately the same manner as the circuit board 10A according to the first embodiment described above. However, the former is different from the latter in that a metal plate 40, for which the Ni plating layer 38 is not formed on the upper surface, is used.

Therefore, the method for producing the circuit board 10B according to the second embodiment is the same as the method for producing the circuit board 10A according to the first embodiment described above except that a resist 80 is formed on the metal plate 40, and then portions of the metal plate 40, which are exposed from windows 80a of the resist 80, are subjected to an etching treatment with an aqueous solution of ferric chloride or an aqueous solution of cupric chloride to form the circuit 36.

In this case, it is preferable that the sandblast treatment for the circuit board 10B is performed under a condition in which the circuit 36 remains on the insulating substrate 32 at a stage at which the conductive reactive layer 70 remaining at the metal-removed portion 36a of the circuit 36 is removed.

Figure 34:
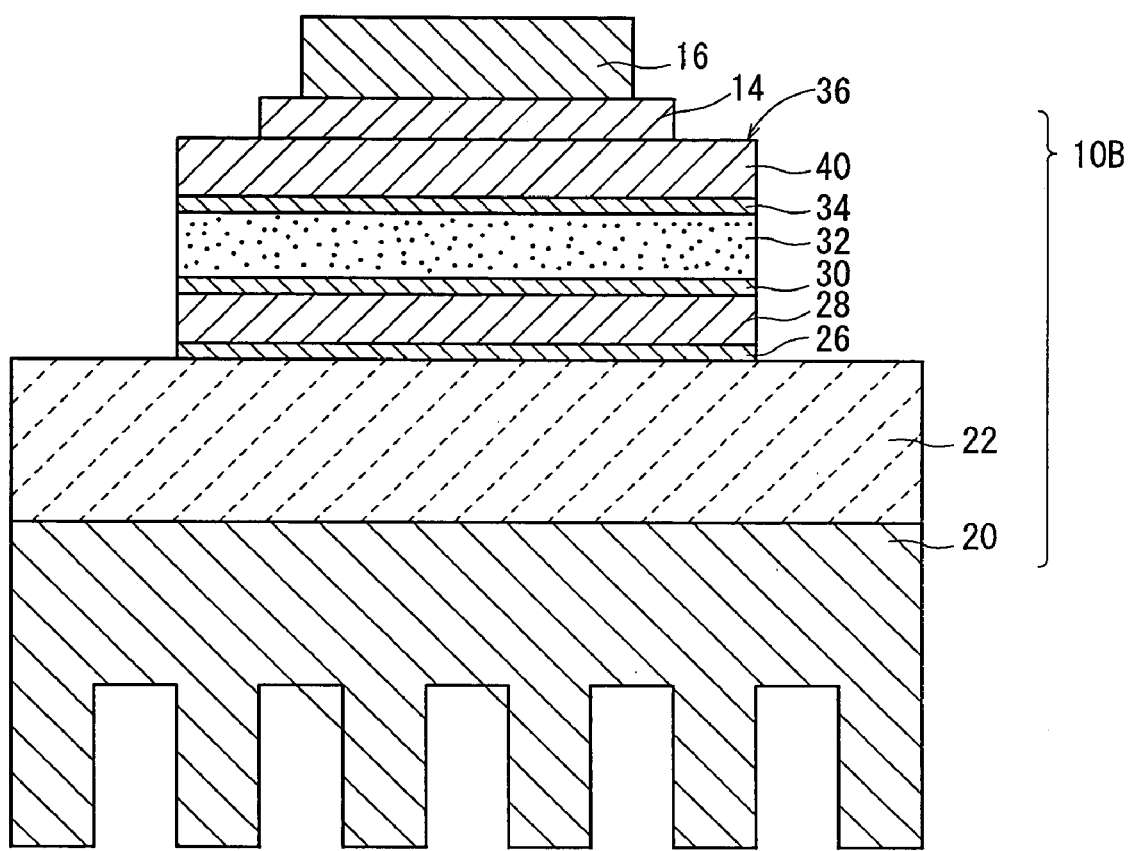
FIG. 34 is a sectional view illustrating a circuit board having a structure in which a fin-shaped metal plate is joined to a lower surface of a heat sink member.
Figure 35:
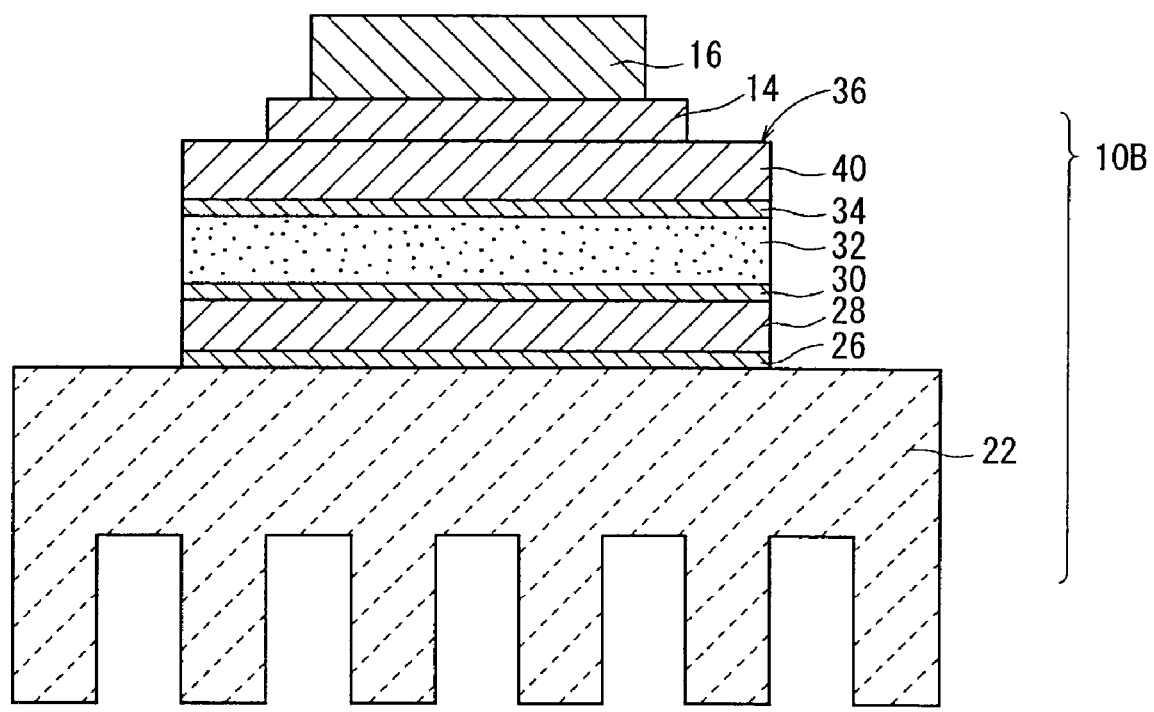
FIG. 35 is a sectional view illustrating a circuit board in which a heat sink member itself is fin-shaped.
Figure 36:
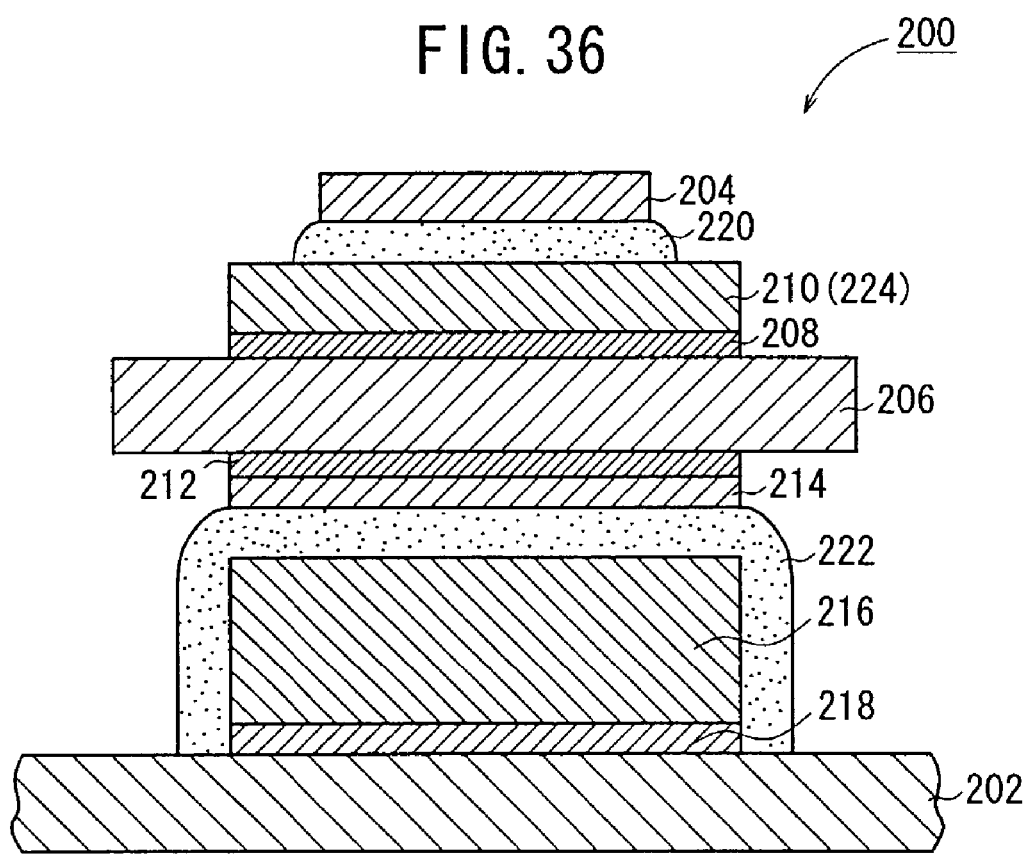
FIG. 36 is a vertical sectional view illustrating a conventional electronic part.
Figure 37:
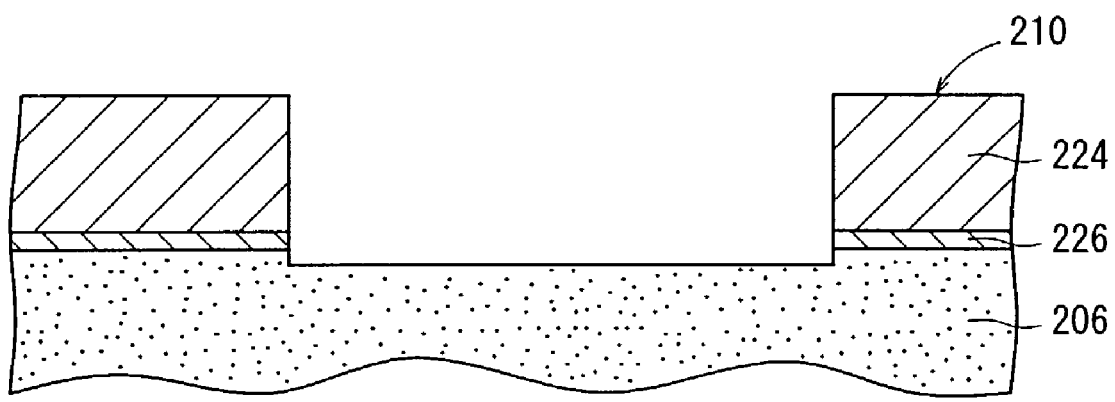
FIG. 37 is a magnified sectional view illustrating a part of a circuit and an insulating substrate of the conventional circuit board.

The embodiment described above is illustrative of the case in which the flat plate is used for the metal plate 18 joined to the lower surface of the heat spreader member 22. Alternatively, as shown in FIG. 34, a metal plate 18, which has a shape of fin, may be joined. Further alternatively, as shown in FIG. 35, the heat spreader member 22 itself may have a shape of fin.

The circuit board and the method for producing the same according to the present invention are not limited to the embodiments described above, which may be embodied in other various forms without deviating from the gist or essential characteristics of the present invention.

As described above, according to the circuit board and the method for producing the same according to the present invention, the etching residue including, for example, the conductive reactive layer, which remains on the insulating substrate, can be removed with ease. It is possible to obtain the circuit board which has excellent appearance and characteristics.

What is claimed is:

1. A method for producing a circuit board having a metal circuit pattern on an insulating substrate, said method comprising the steps of:

joining a metal plate onto a surface of said insulating substrate using a hard brazing member containing an active element;

performing an etching treatment on said metal plate to form said metal circuit pattern from said metal plate, said etching treatment exposing a conductive reactive layer that is created by a reaction between said active element of said hard brazing member and said insulating substrate during said joining step; and removing a portion of said conductive reactive layer by a sandblast treatment to expose said surface of said insulating substrate adjacent said metal circuit pattern to thereby obtain said circuit board having said metal circuit pattern on said insulating substrate.

2. The method for producing a circuit board according to claim 1, wherein said joining step is performed at a temperature of not less than a solidus curve of said hard brazing member and not more than a liquidus curve of said hard brazing member.

3. The method for producing a circuit board according to claim 1, wherein during said removing step, said sandblast treatment is performed over an entire portion of said surface of said insulating substrate, including said metal circuit pattern.

4. The method for producing a circuit board according to claim 1, wherein said removing step of selectively masking at least a portion of said surface of said insulating substrate, including said metal circuit pattern, and removing said conductive reactive layer by performing said sandblast treatment to expose unmasked portions of said surface of said insulating substrate.

5. The method for producing a circuit board according to claim 4, wherein said removing step comprises a plurality of said steps of selectively masking different portions of said surface of said insulating substrate, including said metal circuit pattern, and wherein said sandblast treatment is repeatedly performed using each of said plurality of masks such that unmasked portions of said conductive reactive layer exposed by respective windows of said plurality of masks are selectively removed to expose portions of said surface of said insulating substrate.

6. The method for producing a circuit board according to claim 1, wherein said metal plate comprises a metal selected from the group consisting of Cu, Cu alloy, Al, and Al alloy.

7. The method for producing a circuit board according to claim 1, said metal plate comprises a plating layer formed on an upper surface thereof.

8. The method for producing a circuit board according to claim 7, wherein said plating layer comprises a Ni plating layer.

9. The method for producing a circuit board according to claim 1, wherein said active element of said hard brazing member comprises at least one element selected from the group consisting of Group 2A, Group 3A, Group 4A, Group 5A and Group 4B elements in the periodic table.

10. The method for producing a circuit board according to claim 1, wherein said sandblast treatment is performed such that at least said metal circuit pattern remains on said surface of said insulating substrate when said surface of said insulating substrate is exposed.

11. The method for producing a circuit board according to claim 10, further comprising a step of forming a plating layer on said metal circuit pattern; wherein said sandblast treatment is performed such that said plating layer remains on said metal circuit pattern when said surface of said insulating substrate is exposed.

12. The method for producing a circuit board according to claim 1, wherein a media for said sandblast treatment comprises grains that are finer than mesh #180.

13. The method for producing a circuit board according to claim 12, wherein said grains of said media for said sandblast treatment comprise one of $Al_2O_3$ and SiC.

14. The method for producing a circuit board according to claim 12, wherein an air pressure of said sandblast treatment is in a range of 0.1 MPa to 0.25 MPa.

15. A method for producing a circuit board having a metal circuit pattern on an insulating substrate, said method comprising the steps of:
  performing a pressing treatment to form said metal circuit pattern from said metal plate;
  forming a bridge for connecting parts of said metal circuit pattern by half blanking said metal plate;
  joining said metal circuit pattern onto a surface of said insulating substrate using a hard brazing member containing an active element;
  cutting said bridge after said joining step; and
  removing a portion of a conductive reactive layer that is created by a reaction between said active element of said hard brazing member and said insulating substrate during said joining step by a sandblast treatment to expose said surface of said insulating substrate adjacent said metal circuit pattern to thereby obtain said circuit board having said metal circuit pattern on said insulating substrate.

16. The method for producing a circuit board according to claim 15, wherein said bridge forming step comprises etching said metal plate.

17. The method according to claim 15, wherein said half blanking is performed such that said bridge has a thickness that is less than a thickness of said metal plate from which said metal circuit pattern is formed.

* * * * *

UNITED STATES PATENT AND TRADEMARK OFFICE
CERTIFICATE OF CORRECTION

PATENT NO. : 7,069,645 B2 Page 1 of 1
APPLICATION NO. : 10/107893
DATED : July 4, 2006
INVENTOR(S) : Takahiro Ishikawa et al.

It is certified that error appears in the above-identified patent and that said Letters Patent is hereby corrected as shown below:

Column 27

*Line 5:* please add --comprises a step-- after "removing step"

Signed and Sealed this

Twelfth Day of September, 2006

JON W. DUDAS
*Director of the United States Patent and Trademark Office*